United States Patent
Lee et al.

(10) Patent No.: US 12,200,982 B2
(45) Date of Patent: Jan. 14, 2025

(54) DISPLAY DEVICE

(71) Applicant: SAMSUNG DISPLAY CO., LTD., Yongin-si (KR)

(72) Inventors: Sun Hwa Lee, Yongin-si (KR); Mu Kyung Jeon, Ulsan (KR); Il Nam Kim, Hwaseong-si (KR); Ji Hun Ryu, Hwaseong-si (KR); Ki Hyun Pyo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/349,847

(22) Filed: Jul. 10, 2023

(65) Prior Publication Data

US 2023/0371321 A1  Nov. 16, 2023

Related U.S. Application Data

(63) Continuation of application No. 17/929,535, filed on Sep. 2, 2022, now Pat. No. 11,700,752, which is a
(Continued)

(30) Foreign Application Priority Data

Feb. 7, 2020  (KR) ........................ 10-2020-0014735

(51) Int. Cl.
*H01L 33/48*     (2010.01)
*G06F 3/041*     (2006.01)
(Continued)

(52) U.S. Cl.
CPC ......... *H10K 59/126* (2023.02); *G06F 3/0412* (2013.01); *G06V 40/1318* (2022.01);
(Continued)

(58) Field of Classification Search
CPC .. H10K 59/126; H10K 59/131; H10K 59/353; H10K 50/86; G06V 40/1318;
(Continued)

(56) References Cited

U.S. PATENT DOCUMENTS 10,685,202 B2  6/2020  Kim et al.
11,075,253 B2  7/2021  Kong et al.
(Continued)

FOREIGN PATENT DOCUMENTS

KR  10-2018-0005588 A  1/2018
KR  10-2018-0034750 A  4/2018
(Continued)

*Primary Examiner* — Abdul-Samad A Adediran
(74) *Attorney, Agent, or Firm* — Lewis Roca Rothgerber Christie LLP

(57) ABSTRACT

Embodiments of the present disclosure provide a display device comprising: a substrate; a thin film transistor layer on a first surface of the substrate and including a first hole; a light emitting element layer on the thin film transistor layer and including a light emitting element; a first light blocking layer between the substrate and the thin film transistor layer and including a second hole overlapping the first hole in a thickness direction of the substrate; and a second light blocking layer between the thin film transistor layer and the light emitting element layer and including a third hole overlapping the first hole and the second hole in the thickness direction of the substrate.

15 Claims, 25 Drawing Sheets

Related U.S. Application Data continuation of application No. 17/003,365, filed on Aug. 26, 2020, now Pat. No. 11,437,459.

(51) Int. Cl.
| | |
|---|---|
| *G06V 40/13* | (2022.01) |
| *G09G 3/3233* | (2016.01) |
| *G09G 3/3258* | (2016.01) |
| *H01L 25/18* | (2023.01) |
| *H10K 59/126* | (2023.01) |
| *H10K 59/131* | (2023.01) |
| *G06F 3/044* | (2006.01) |
| *H10K 59/35* | (2023.01) |

(52) U.S. Cl.
CPC ......... *G09G 3/3233* (2013.01); *G09G 3/3258* (2013.01); *H01L 25/18* (2013.01); *H10K 59/131* (2023.02); *G06F 3/0443* (2019.05); *G06F 3/0446* (2019.05); *G09G 2310/0202* (2013.01); *G09G 2360/14* (2013.01); *H10K 59/353* (2023.02)

(58) Field of Classification Search
CPC .... G06F 3/0412; G06F 3/0446; G06F 3/0443; G06F 21/32; G09G 3/3258; G09G 2310/0202; G09G 2360/14; H01L 25/18
See application file for complete search history.

(56) References Cited

U.S. PATENT DOCUMENTS

| | | |
|---|---|---|
| 11,341,763 B2 | 5/2022 | Kim et al. |
| 2018/0046837 A1 | 2/2018 | Gozzini et al. |
| 2018/0130857 A1* | 5/2018 | Lee ................ H10K 50/86 |
| 2019/0197286 A1 | 6/2019 | Kim et al. |
| 2020/0042759 A1 | 2/2020 | Kim et al. |
| 2021/0020810 A1* | 1/2021 | Lius .................. G06F 21/32 |
| 2021/0036090 A1* | 2/2021 | Hong ................ H10K 59/353 |

FOREIGN PATENT DOCUMENTS

| | | |
|---|---|---|
| KR | 10-2018-0078813 | 7/2018 |
| KR | 10-2018-0100140 A | 9/2018 |
| KR | 10-2019-0064004 A | 6/2019 |

* cited by examiner

PH : H1,H2,H3

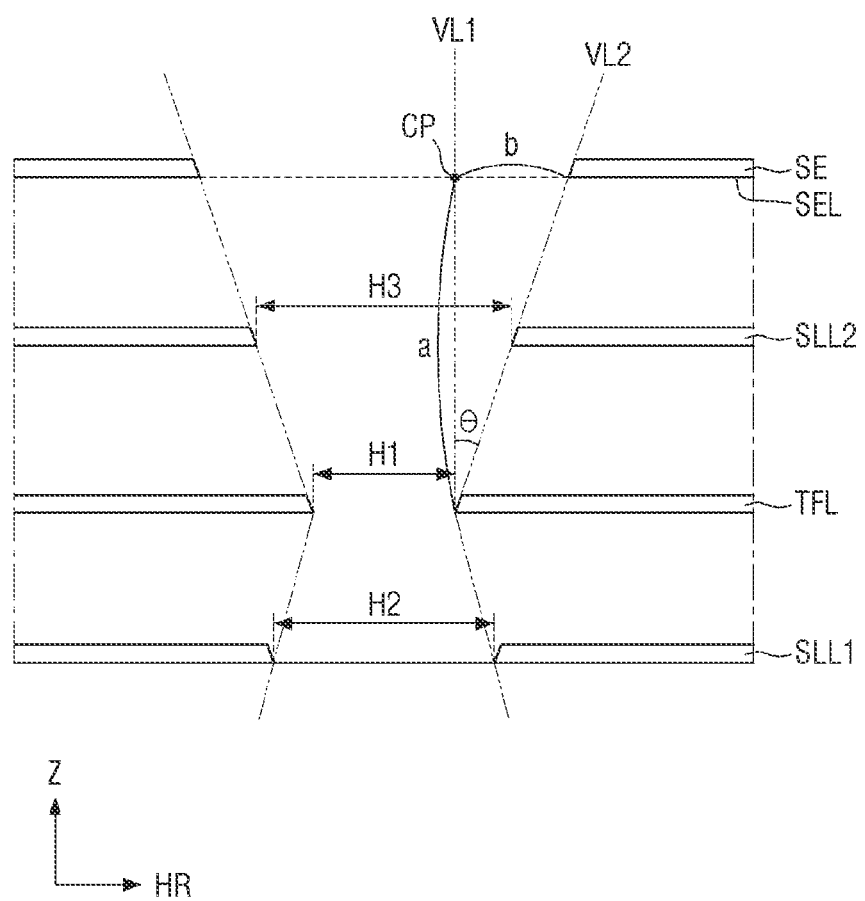

DISPLAY DEVICE

CROSS-REFERENCE TO RELATED APPLICATIONS

This application is a continuation of U.S. patent application Ser. No. 17/929,535, filed Sep. 2, 2022, which is a continuation of U.S. patent application Ser. No. 17/003,365, filed Aug. 26, 2020, now U.S. Pat. No. 11,437,459, which claims priority to and the benefit of Korean Patent Application No. 10-2020-0014735, filed Feb. 7, 2020, the entire content of all of which is incorporated herein by reference.

BACKGROUND

1. Field

Aspects of one or more embodiments of the present disclosure relate to a display device.

2. Description of the Related Art

The importance of a display device has increased with the development of multimedia. Accordingly, various types (kinds) of display devices, such as a liquid crystal display (LCD) and an organic light emitting display (OLED), have been used.

A display device is applied to various suitable electronic appliances such as smart phones, tablet PCs, notebook computers, monitors, and televisions (TVs). Recently, due to the development of mobile communication technology, the use of portable electronic appliances such as smart phones, tablets, and notebook computers has greatly increased. Privacy information such as contacts, call history, messages, photos, memos, user's web surfing information, user's location information, and financial information are stored in portable electronic appliances. Therefore, in order to protect personal information stored in portable electronic appliances, fingerprint authentication for authenticating a fingerprint, which is a user's biometric information, is used. The display device may include a fingerprint sensor for fingerprint authentication.

Meanwhile, when the fingerprint sensor is disposed in the bezel area or the non-display area of the display device, there is a limit in widening the display area of the display device. In other words, the display area may be reduced.

SUMMARY

Aspects of example embodiments of the present disclosure are directed toward a display device capable of blocking or substantially blocking ambient light incident on sensor pixels of a fingerprint sensor when the fingerprint sensor is disposed in a display area of the display device.

Aspects of example embodiments of the present disclosure are directed toward a fingerprint sensor in the display area of the display device where a light blocking layer may be formed in the display area of the display device to block or substantially block ambient light incident on or directed toward the sensor pixels of the fingerprint sensor.

However, example embodiments of the present disclosure are not limited to those set forth herein. The above and other example embodiments of the present disclosure will become more apparent to one of ordinary skill in the art to which the present disclosure pertains by referencing the detailed description of the present disclosure given below.

According to some example embodiments of the present disclosure, there is provided a display device including: a substrate; a thin film transistor layer on a first surface of the substrate and including a first hole; a light emitting element layer on the thin film transistor layer and including a light emitting element; a first light blocking layer between the substrate and the thin film transistor layer and including a second hole overlapping the first hole in a thickness direction of the substrate; and a second light blocking layer between the thin film transistor layer and the light emitting element layer and including a third hole overlapping the first hole and the second hole in the thickness direction of the substrate.

According to some example embodiments of the present disclosure, there is provided a display device including: a substrate; a thin film transistor layer on a first surface of the substrate and including a first hole; a light emitting element layer on the thin film transistor layer and including a light emitting element; an encapsulation layer on the light emitting element layer; and a sensor electrode layer on the encapsulation layer and including sensor electrodes. The sensor electrodes do not overlap the first hole in a thickness direction of the substrate.

According to the aforementioned and other example embodiments of the present disclosure, a first hole of a thin film transistor layer, a second hole of a first light blocking layer disposed under the thin film transistor, and a third hole of a second light blocking layer on the thin film transistor may be disposed to overlap each other in a thickness direction of a substrate, thereby forming a pinhole through which light reflected from a user's fingerprint passes through a sub-pixel and proceeds. Therefore, even when a fingerprint sensor is disposed under the substrate, each of sensor pixels of the fingerprint sensor may detect the light reflected from the user's fingerprint through the pinhole.

Moreover, a part of a k-th scan line, a part of a j-th data line, a part of a second connection electrode, and a part of a (k−1)-th scan line may not overlap the first light blocking layer in the thickness of the substrate. Therefore, an overlapping area between the scan lines and the first light blocking layer, an overlapping area between the initialization voltage line and the first light blocking layer, and an overlapping area between the data lines and the first light blocking layer may be reduced, so that load of the scan lines, load of the initialization voltage line, and load of the data lines may be reduced.

Furthermore, a driving electrode, a sensing electrode, and a part of a second connection portion, which are disposed in an area overlapping the pinhole of the sub-pixel in the thickness direction of the substrate may be reduced, so that the light reflected from the user's fingerprint may proceed to the pinhole of the sub-pixel without being blocked or substantially blocked by the second connection portion. Therefore, the light reflected from the user's fingerprint may be incident on the sensor pixel of the fingerprint sensor overlapping the pinhole of the sub-pixel in the thickness direction through the pinhole of the sub-pixel.

Other aspects and example embodiments may be apparent from the following detailed description, the drawings, and the claims and equivalents thereof.

BRIEF DESCRIPTION OF THE DRAWINGS

The above and other example embodiments and features of the present disclosure will become more apparent by describing example embodiments thereof with reference to the attached drawings, in which:

FIG. 24 is an exemplary view of the first light blocking layer, second light blocking layer and sensor electrode of FIG. 23.

DETAILED DESCRIPTION

Figure 1:
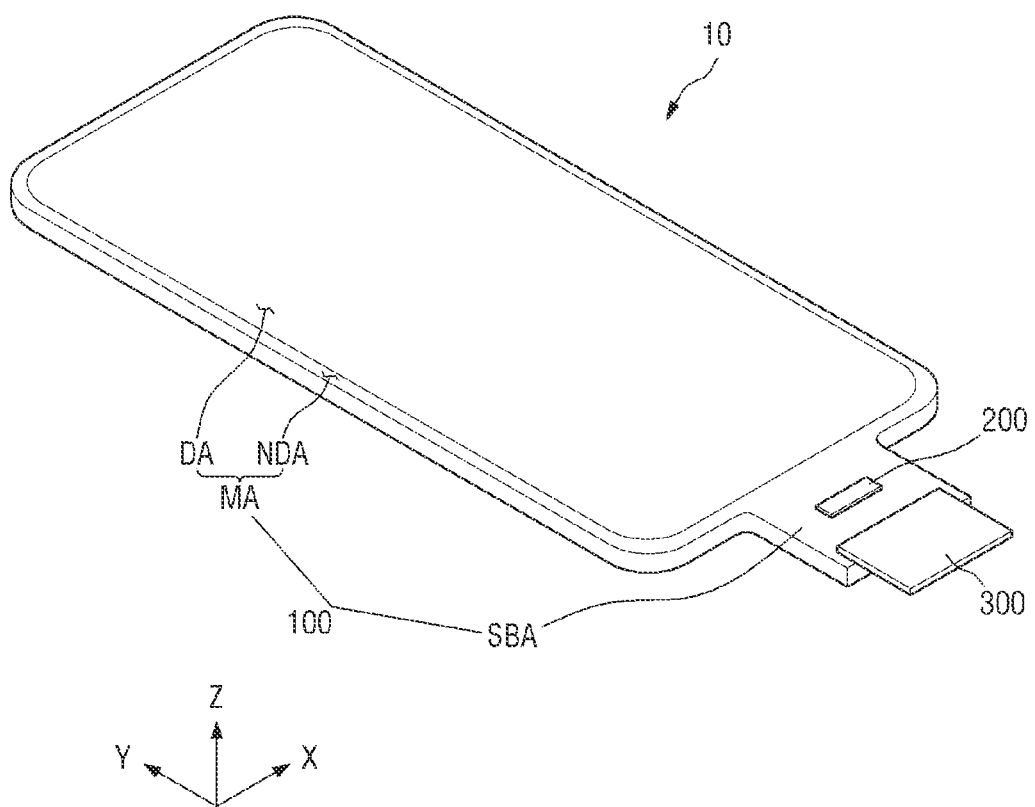
FIG. 1 is a perspective view of a display device according to an embodiment.

The present disclosure will now be described more fully hereinafter with reference to the accompanying drawings, in which some embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The same reference numbers indicate the same components throughout the specification. In the attached figures, the thickness of layers and regions may be exaggerated for clarity.

Herein, the use of the term "may," when describing embodiments of the present disclosure, refers to "one or more embodiments of the present disclosure." As used herein, the term "and/or" includes any and all combinations of one or more of the associated listed items. As used herein, the singular forms "a", "an" and "the" are intended to include the plural forms as well, unless the context clearly indicates otherwise. As used herein, expressions such as "at least one of", "one of", and "selected from", when preceding a list of elements, modify the entire list of elements and do not modify the individual elements of the list.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present. As used herein, the term "substantially," "about," and similar terms are used as terms of approximation and not as terms of degree, and are intended to account for the inherent deviations in measured or calculated values that would be recognized by those of ordinary skill in the art.

As used herein, the phrases such as "a plan view" may refer to a view from top or from a direction normal to the display area of the display device.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present disclosure will be described with reference to the attached drawings.

Figure 2:
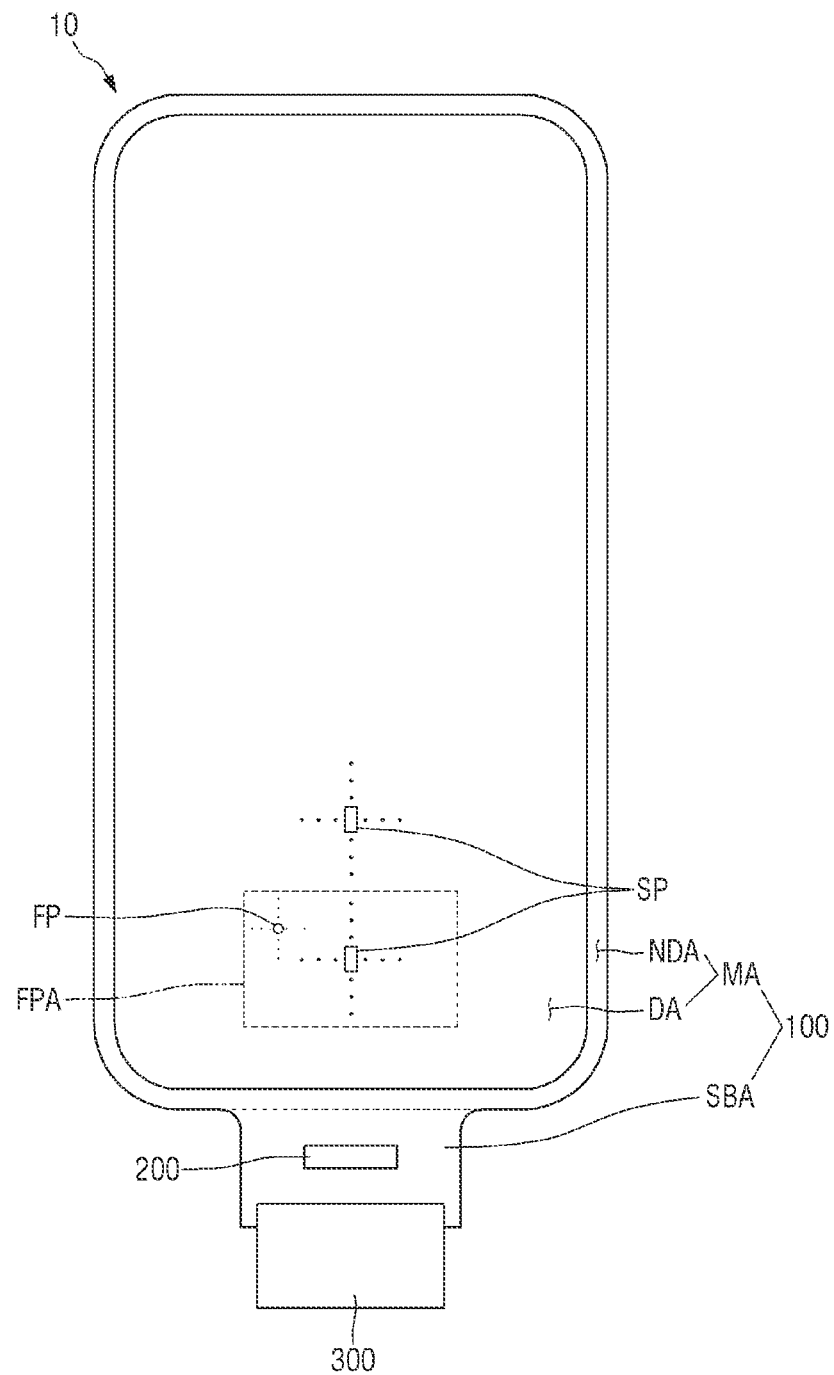
FIG. 2 is a plan view of a display device according to an embodiment.
Figure 3:
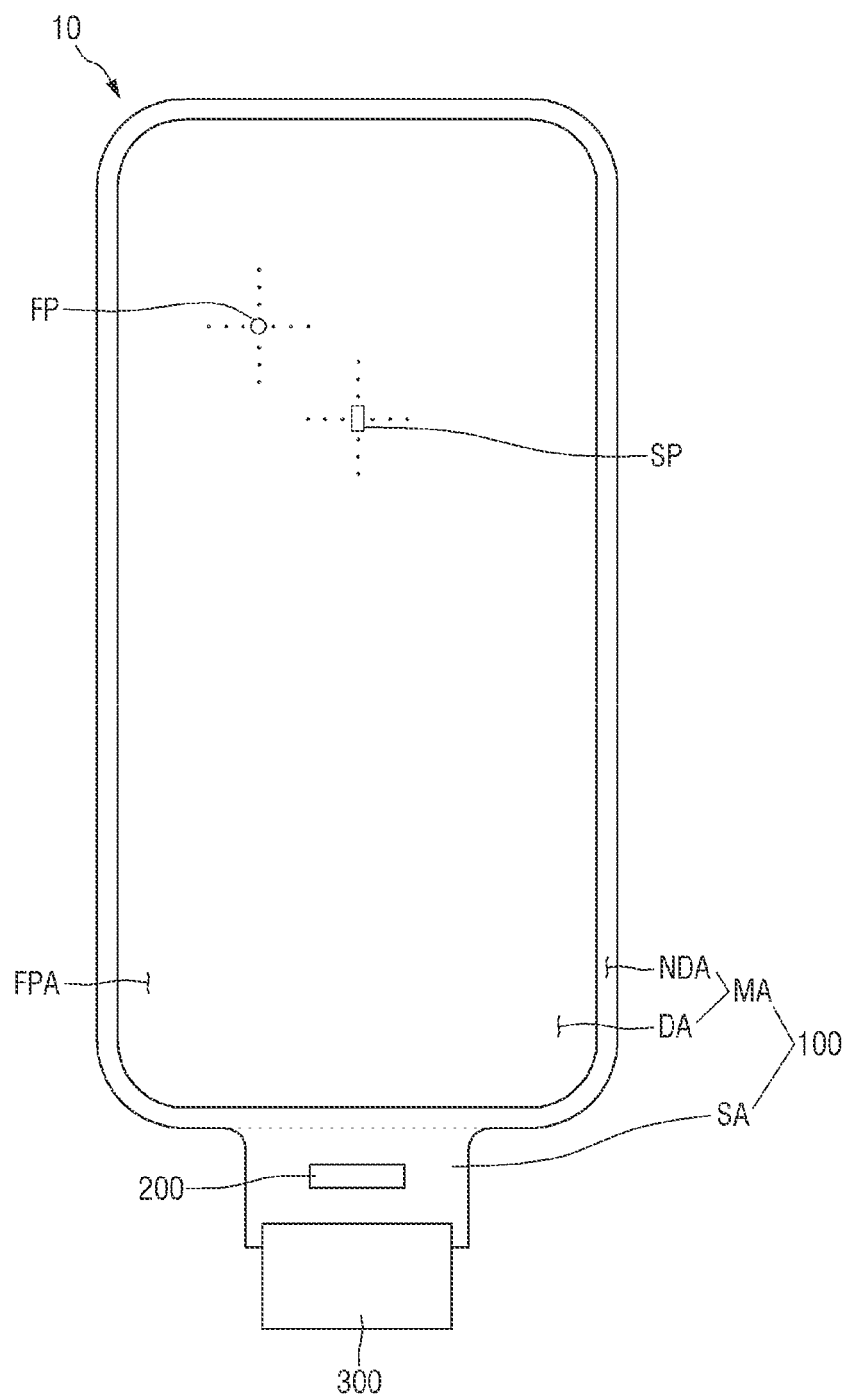
FIG. 3 is a plan view of a display device according to another embodiment.
Figure 4:
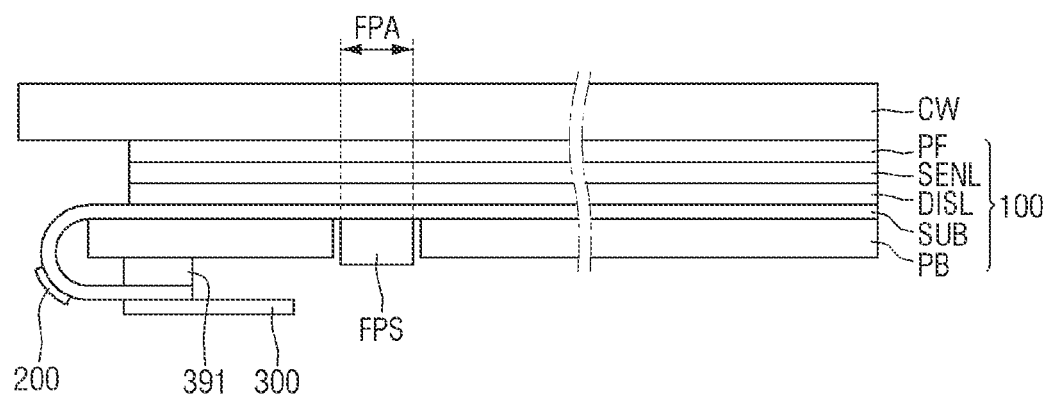
FIG. 4 is a side view of a display device according to an embodiment.

FIG. 1 is a perspective view of a display device according to an embodiment, FIG. 2 is a plan view of a display device according to an embodiment, FIG. 3 is a plan view of a display device according to another embodiment, and FIG. 4 is a side view of a display device according to an embodiment.

As used herein, the first direction (X-axis direction) may be a direction parallel to the short side of the display device 10 on a plane. For example, a horizontal direction of the display device 10. The second direction (Y-axis direction) may be a direction parallel to the long side of the display device 10 on a plane. For example, a vertical direction of the display device 10. The third direction (Z-axis direction) may be a thickness direction of a substrate SUB (e.g., a substrate SUB includes the sub-area SBA shown in FIG. 1).

Referring to FIGS. 1-4, a display device 10, which is a device for displaying a moving image or a still image, may be used as a display screen of various products such as televisions, notebooks, monitors, billboards, internet of things (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs (UMPCs).

The display device 10 may be a light emitting display device such as an organic light emitting display device using an organic light emitting diode, a quantum dot light emitting display device including a quantum dot light emitting layer, an inorganic light emitting display device using an inorganic semiconductor, or a micro light emitting display device using a micro light emitting diode (LED). Hereinafter, the display device 10 will be described assuming that the display device 10 is an organic light emitting display device, but the embodiments of the present disclosure are not limited thereto.

The display device 10 includes a display panel 100, a display driver 200, and a display circuit board 300.

The display panel 100 may have a rectangular planar shape having short sides in the first direction (X-axis direction) and long sides in the second direction (Y-axis direction) crossing the first direction (X-axis direction). The corner where the short side in the first direction (X-axis direction) meets the long side in the second direction (Y-axis direction) may be formed to have a curved shape (e.g., a round shape) or have an angular shape (e.g., a right angle shape). The planar shape of the display panel 100 is not limited to a specific shape such as a rectangular shape, and may be formed in another polygonal shape, circular shape, or elliptical shape.

The display panel 100 may be formed to be flat (e.g., the display panel 100 may have a flat surface), but embodiments of the present disclosure are not limited thereto. For example, the display panel 100 may include a curved portion formed at the left and right ends thereof and having a constant curvature or a variable curvature (e.g., the curvature changes as distance from the left and right ends of the display panel 100 increases). In addition, the display panel 100 may be flexible to be bent, warped, folded, or rolled.

The display panel 100 may include a substrate SUB, a display layer DISL, a sensor electrode layer SENL, and a panel lower cover PB.

The substrate SUB may be made of an insulating material such as glass, quartz, and/or a polymer resin. The substrate SUB may be a rigid substrate and/or a flexible substrate capable of bending, folding, rolling, and/or the like.

The substrate SUB may include a main area MA and a sub-area SBA. The main area MA may be an area where the display layer DISL is disposed. The sub-area SBA may protrude from one side of the main area MA in the second direction (Y-axis direction). As shown in FIG. 4, the length of the sub area SBA the first direction (X-axis direction) is smaller (or less) than the length of the main area MA in the first direction (X-axis direction), and the length of the sub area SBA in the second direction (Y-axis direction) may be smaller (or less) than the length of the main area MA in the second direction (Y-axis direction), but the embodiments of the present disclosure are not limited thereto. The sub-area SBA may be bent, and disposed on the lower surface of the substrate SUB. In one or more embodiments, the sub-area SBA may be bent around the panel lower cover PB. The sub-area SBA may overlap the main area MA in the thickness direction (Z-axis direction) of the substrate SUB. The display circuit board 300 and the display driver 200 may be disposed in the sub-area SBA.

The display layer DISL may be disposed on the substrate SUB. The display layer DISL may be a layer including pixels and displaying an image. The display layer DISL may include a thin film transistor layer in which thin film transistors are formed, a light emitting element layer in which light emitting elements for emitting light are formed, and an encapsulation layer for encapsulating the light emitting element layer.

The display layer DISL may be divided into a display area DA and a non-display area NDA. The display area DA may be an area in which a plurality of sub-pixels SP are arranged to display an image. The non-display area NDA may be an area where no image is displayed. The non-display area NDA may be disposed to surround the display area DA. In the display area DA, scan lines, data lines, driving voltage lines, and the like connected to the pixels may be arranged. In one or more embodiments, the plurality of sub-pixels SP may be in the display area DA. In the non-display area NDA, a scan driver for applying scan signals to the scan lines, fan-out lines connecting the data lines and the display driver 200 may be arranged.

The display area DA may include a fingerprint recognition area FPA. The fingerprint recognition area FPA refers to an area overlapping a fingerprint sensor FPS including sensor pixels FP in the thickness direction (Z-axis direction) of the substrate. Each of the sensor pixels FP may be disposed to overlap at least one sub-pixel SP. The arrangement position of the sensor pixels FP may be set in consideration of the amount of light reception, resolution, and/or cross-talk desired by the fingerprint sensor FPS for fingerprint recognition. The sensor pixels FP may include a light sensing unit such as a photo transistor or a photo diode.

As shown in FIG. 2, the fingerprint recognition area FPA may be a part of the display area DA. In this case, as shown in FIG. 4, the fingerprint sensor FPS may be formed as a separate module and attached to the lower surface of the substrate SUB. The fingerprint sensor FPS may not overlap the panel lower cover PB in the thickness direction (Z-axis direction) of the substrate. In one or more embodiments, the fingerprint sensor FPS is at a same level as the panel lower cover FB and the fingerprint sensor FPS is between different portions of the panel lower cover PB.

In one or more embodiments, the fingerprint recognition area FPA may be an area substantially the same as the display area DA as shown in FIG. 3. That is, the display area DA and the fingerprint recognition area FPA may coincide, and in this case, fingerprint recognition may be possible in the entire display area DA. In this case, the fingerprint sensor FPS may be disposed between the substrate SUB and the panel lower cover PB. The fingerprint sensor FPS may be formed of a thin film transistor array including photo diodes and thin film transistors. In one or more embodiments, the fingerprint sensor FPS may be formed of a semiconductor wafer including photo diodes and transistors.

The sensor electrode layer SENL may be disposed on the display layer DISL. The sensor electrode layer SENL may include sensor electrodes, and may be a layer for detecting a user's touch.

A polarizing film PF may be disposed on the sensor electrode layer SENL. The polarizing film PF may include a phase retardant film such as a linear polarizing plate and a quarter-wave plate. The phase retardant film may be disposed on the sensor electrode layer SENL, and the linear polarizing plate may be disposed on the phase retardant film.

A cover window CW may be disposed on the polarizing film PF. The cover window CW may be made of a transparent material, and may include glass and/or plastic. For example, the cover window CW may include ultra thin glass (UTG) having a thickness of 0.1 mm (about 0.1 mm) or less. The cover window CW may include a transparent polyimide film. The cover window CW may be attached onto the polarizing film PF by a transparent adhesive member such as an optically clear adhesive (OCA) film.

The panel lower cover PB may be disposed under the substrate SUB. The lower panel cover PB may be attached to the lower surface of the substrate SUB through an adhesive member. The adhesive member may be a pressure sensitive adhesive (PSA). The panel lower cover PB may include at least one of a light absorbing member for absorbing light (e.g., light incident from the outside), a buffer member for absorbing shock (e.g., shock caused from the outside), or a heat dissipation member for efficiently dissipating heat of the display panel 100.

The light absorbing member may be disposed under the substrate SUB. The light absorbing member may block the transmission of light to prevent or substantially prevent components disposed under the light absorbing member (e.g., a display circuit board 300 and the like) from being viewed from the display panel 100 (e.g., viewed from a viewing angle facing the display panel 100). The light absorbing member may include a light absorbing material such as a black pigment or a black dye.

The buffer member may be disposed under the light absorbing member. The buffer member absorbs an external shock to prevent or substantially prevent the display panel 100 from being damaged. The buffer member may be composed of a single layer or a plurality of layers. For example, the buffer member may be formed of a polymer resin such as polyurethane, polycarbonate, propylene, and/or polyethylene, or may be formed of an elastic material such as a sponge obtained by foaming rubber, a urethane-based material, and/or an acrylic-based material.

The heat dissipation member may be disposed under the buffer member. The heat dissipation member may include a first heat dissipation layer including graphite or carbon nanotubes and a second heat dissipation layer blocking electromagnetic waves and formed of a metal thin film such as copper, nickel, ferrite, and/or silver.

The display driver 200 outputs signals and voltages for driving the display panel 100. For example, the display driver 200 may supply data voltages to the data lines. The display driver 200 may supply driving voltages to the driving voltage lines and supply scan control signals to the scan driver. The display driver 200 may be formed of an integrated circuit (IC) and may be attached onto the substrate SUB of the display panel 100 by a chip on glass (COG) method, a chip on plastic (COP) method, or an ultrasonic bonding method. In one or more embodiments, the display driver 200 may be attached onto the display circuit board 300.

The display circuit board 300 may be disposed in the non-display area NDA at one edge of the display panel 100. For example, the display circuit board 300 may be disposed in the non-display area NDA at the lower edge of the display panel 100. The display circuit board 300 may be bent toward the bottom of the display panel 100 and may be attached to one edge of the adhesive member 391 disposed on the lower surface of the panel lower cover PB. The display circuit board 300 may be attached to and fixed to the lower surface of the panel lower cover PB through the adhesive member 391. The adhesive member 391 may be a pressure-sensitive adhesive. In one or more embodiments, the display circuit board 300 may be omitted, and one edge of the substrate SUB may be bent toward the lower portion of the display panel 100.

The display circuit board 300 may be attached onto display pads of the display panel 100 using an anisotropic conductive film. Thus, the display circuit board 300 may be connected (e.g., electrically connected) to the display pads of the display panel 100. The display circuit board 300 may be a flexible printed circuit board, a printed circuit board, or a flexible film such as a chip on film.

As shown in FIGS. 1-4, the display area DA includes the fingerprint sensor area FPA having the sensor pixels FP to enable fingerprint recognition in the display area DA. Because the fingerprint sensor does not have to be disposed in the non-display area NDA of the display device 10, the display area DA of the display device 10 may be widened.

Although the fingerprint recognition area FPA will be described hereinafter as a part of the display area DA for convenience of description, it should be noted that the embodiments of the present disclosure are not limited thereto.

Figure 5:
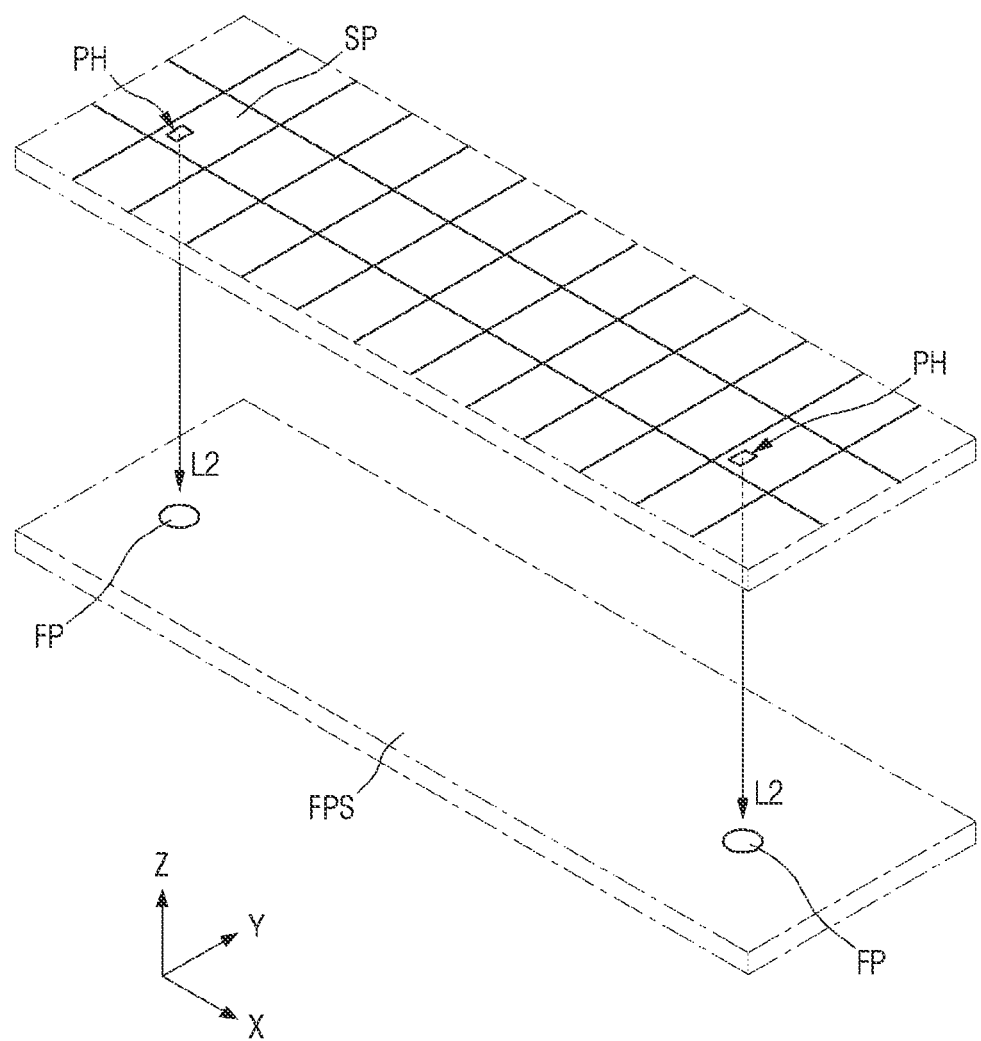
FIG. 5 is an exemplary view illustrating sub-pixels of a display panel and sensor pixels of a fingerprint sensor according to an embodiment.

FIG. 5 is an exemplary view illustrating sub-pixels of a display panel and sensor pixels of a fingerprint sensor according to an embodiment.

Referring to FIG. 5, the sub-pixels SP disposed in the display area DA of the display panel 100 may be arranged in a matrix form in the first direction (X-axis direction) and the second direction (Y-axis direction). However, the arrangement of the sub-pixels SP in embodiments of the present disclosure are not limited thereto, and may be variously arranged in a suitable manner according to the size and shape of the display device 10.

Some of the sub-pixels SP may include pin holes PH. In one or more embodiments, the sub-pixels SP may be divided into or include sub-pixels SP including the pin holes PH and sub-pixels SP not including the pin holes PH. Among the sub-pixels, the number of the sub-pixels including the pin-holes PH may be smaller (or less) than the number of the sub-pixels SP not including the pin holes PH. For example, the sub-pixels SP including the pin holes PH may be arranged for each M sub-pixels (M is a positive integer of 2 or more) in the first direction (X-axis direction). As shown in FIG. 5, the sub-pixels SP including the pin holes PH may be disposed for each 10 sub-pixels in the first direction (X-axis direction). The sub-pixels SP including the pin holes PH may be disposed for each N sub-pixels (N is a positive integer of 2 or more) in the second direction (Y-axis direction). N may be the same as or different from M. The pin holes PH may be spaced apart from each other by 100 μm (about 100 μm) to 450 μm (about 450 μm) in the first direction (X-axis direction). Further, the pin holes PH may be spaced apart from each other by 100 μm (about 100 μm) to 450 μm (about 450 μm) in the second direction (Y-axis direction).

The pin hole PH of the sub-pixel SP may be an optical hole serving or functioning as a path of light. In other words, the pin hole PH may not include elements that reflect light or hinder the progress of light. For example, the pin hole PH of the sub-pixel SP may be a path through which light output from the light emitting element of the light emitting element layer is reflected by the user's fingerprint and proceeds to the sensor pixel FP of the fingerprint sensor FPS. However, the pin hole PH of the sub-pixel SP in embodiments of the present disclosure is not limited thereto and may be a physical hole in which a hole penetrating the sub-pixel SP is formed. In one or more embodiments, the pin hole PH of the sub-pixel SP may be a hole in which an optical hole and a physical hole are combined. In other words, the pin hole PH of the sub-pixel SP, in one or more embodiments, may be a physical hole that does not include elements that reflect light or hinder the progress of light.

Each of the pin holes PH of the sub-pixel SP may overlap the sensor pixel FP of the fingerprint sensor FPS in the third direction (Z-axis direction). Therefore, the sensor pixel FP of the fingerprint sensor FPS may detect light incident through the pin hole PH of the sub-pixel SP.

Figure 6A:
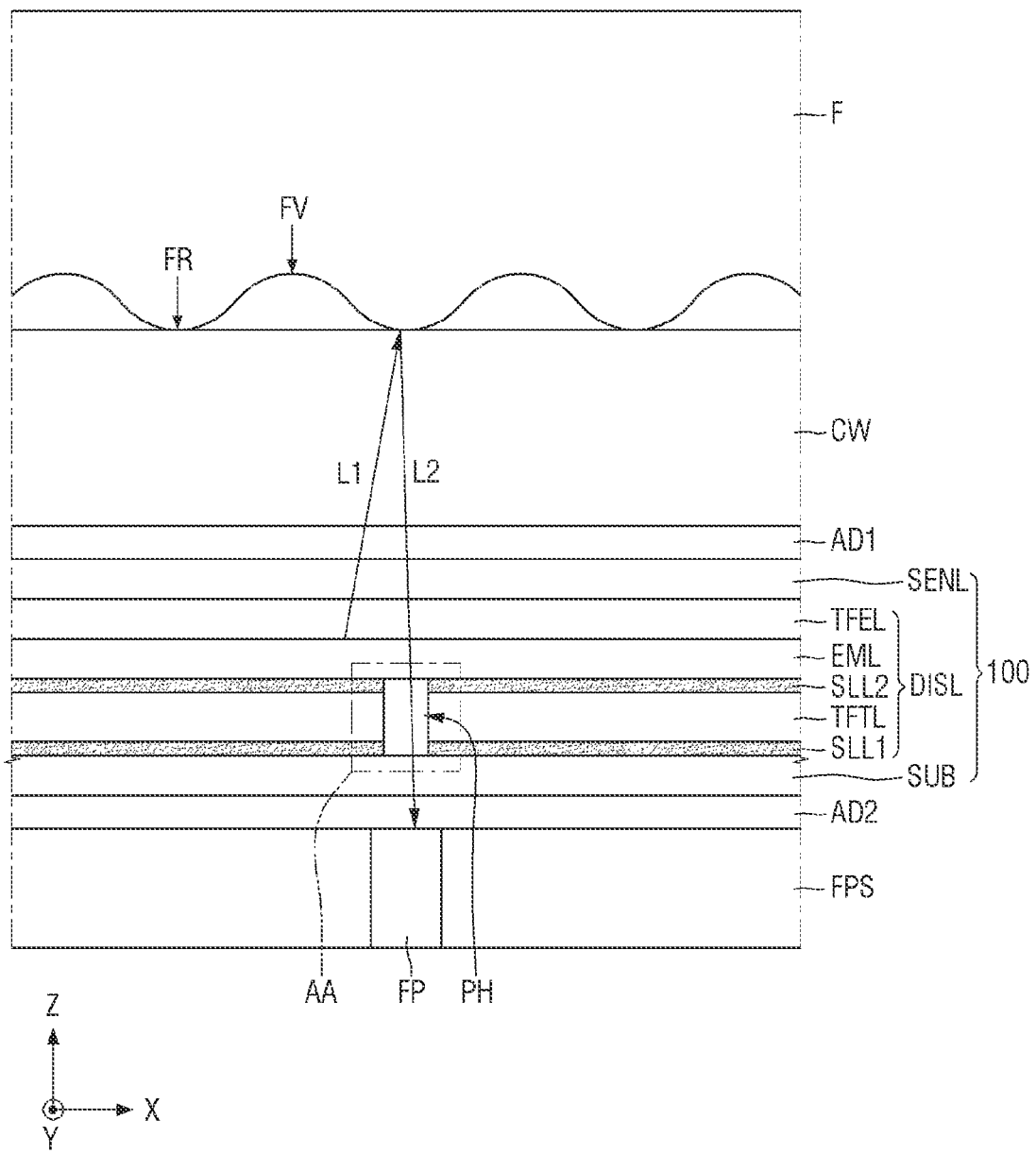
FIG. 6A is a schematic cross-sectional view of a fingerprint recognition area of a display device according to an embodiment.
Figure 6B:
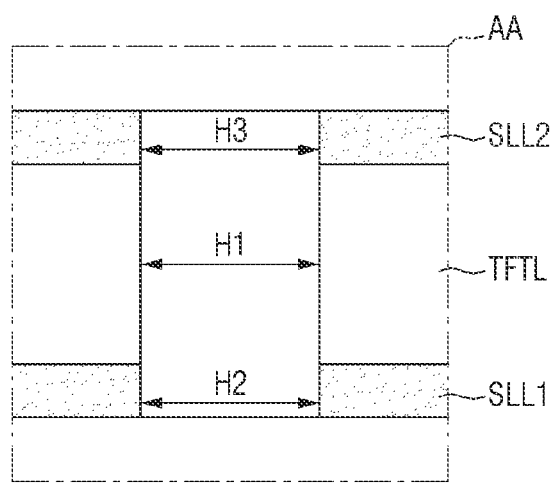
FIG. 6B is an enlarged view of area AA in FIG. 6A.

FIG. 6A is a schematic cross-sectional view of a fingerprint recognition area of a display device according to an embodiment, and FIG. 6B is an enlarged view of area AA in FIG. 6A.

Referring to FIGS. 6A and 6B, the display layer DISL of the display panel 100 may include a first light blocking layer SLL1, a thin film transistor layer TFTL, a second light blocking layer SLL2, a light emitting element layer EML, and an encapsulation layer TFEL.

The first light blocking layer SLL1 may be disposed on one surface of the substrate SUB. The first light blocking layer SLL1 may include a material that blocks light. For example, the first light blocking layer SLL1 may be a metal layer or an organic layer including a black pigment. When the first light blocking layer SLL1 is a metal layer, the first light blocking layer SLL1 may be a single layer or multiple layers including any one of molybdenum (Mo), aluminum (Al), chromium (Cr), gold (Au), titanium (Ti), nickel (Ni), neodymium (Nd), and copper (Cu), or an alloy thereof.

The pin hole PH includes a first hole H1 formed in the thin film transistor layer TFTL, a second hole H2 formed in the first light blocking layer SLL1, and a third hole formed in the second light blocking layer SLL2. The first hole H1, the second hole H2, and the third hole H3 may overlap each other in the third direction (Z-axis direction). In one or more embodiments, the first hole H1, the second hole H2, and the third hole H3 may be connected to form an opening including the first hole H1, the second hole H2, and the third hole H3. Although it is shown in FIGS. 6A and 6B that the length of the first hole H1 in the first direction (X-axis direction), the length of the second hole H2 in the first direction (X-axis direction), and the length of the third hole H3 in the first direction (X-axis direction) are substantially equal to or equal to each other, the embodiments of the present disclosure are not limited thereto. At least one of the length of the first hole H1 in the first direction (X-axis direction), the length of the second hole H2 in the first direction (X-axis direction), or the length of the third hole H3 in the first direction (X-axis direction) may be different from the lengths of the other holes in the first direction (X-axis direction).

The light emitting element layer EML may be disposed on the second light blocking layer SLL2. The light emitting element layer EML may include light emitting elements each including an anode electrode, a light emitting layer, and a cathode electrode. The light emitting element may be an organic light emitting diode including an organic light emitting layer, an inorganic light emitting diode including an inorganic semiconductor, a quantum dot light emitting diode including a quantum dot light emitting layer, and/or a micro light emitting diode chip.

The encapsulation layer TFEL may be disposed on the light emitting element layer EML. The encapsulation layer TFEL may include at least one inorganic layer to prevent or substantially prevent oxygen or moisture from penetrating into the light emitting element layer EML. Further, the encapsulation layer TFEL may include at least one organic layer to prevent or substantially prevent oxygen or moisture from penetrating into the light emitting element layer EML due to foreign matter (e.g., particles) during the manufacturing process.

The sensor electrode layer SENL may be disposed on the encapsulation layer TFEL. The sensor electrode layer SENL includes sensor electrodes, and may be a layer for detecting a user's touch. When the sensor electrode layer SENL includes mutual capacitive sensor electrodes, the sensor electrodes may include driving electrodes and sensing electrodes that cross each other. In this case, the sensor electrode layer SENL may include a first layer in which connection portions connecting driving electrodes are formed and a second layer in which driving electrodes and sensing electrodes are formed. In the mutual capacitive sensor electrodes, voltages charged in mutual capacitance are detected after driving signals are applied to driving electrodes, thereby detecting a user's touch.

Meanwhile, the sensor electrode layer SENL in embodiments of the present disclosure is not limited to including mutual capacitive sensor electrodes of two layers. For example, the sensor electrode layer SENL may include mutual capacitive sensor electrodes of one layer in which driving electrodes and sensing electrodes are formed in one layer. In one or more embodiments, the sensor electrode layer SENL may include self-capacitive sensor electrodes.

The cover window CW may be disposed on the sensor electrode layer SENL. The cover window CW may be attached on the sensor electrode layer SENL by a first adhesive member AD1. The first adhesive member AD1 may be a transparent adhesive member such as an optically clear adhesive (OCA) film.

The fingerprint sensor FPS may be disposed on the other surface of the substrate SUB, which is the opposite surface of one surface of the substrate SUB. The fingerprint sensor FPS may include a plurality of sensor pixels FP. Each of the plurality of sensor pixels FP may overlap the pin holes PH in the thickness direction of the substrate SUB. In other words, each of the plurality of sensor pixels FP may overlap the first hole H1, the second hole H2, and the third hole H3 in the thickness direction of the substrate SUB. Each of the plurality of sensor pixels FP may detect light incident through the pin hole PH.

When a user's finger F is touched on the cover window CW, the light L1 output from the light emitting elements of the light emitting element layer EML may be reflected at the ridge FR or the valley FV of the user's finger F. The light L2 reflected at the ridge FR or the valley FV of the user's finger F passes through the pinhole PH and is sensed by the sensor pixels FP of the fingerprint sensor FPS, thereby recognizing a pattern of the user's fingerprint. In this case, because the amount of the light reflected at the ridge FR of the user's finger F is larger (or greater) than the amount of the light reflected at the valley FV of the user's finger F, the fingerprint sensor FPS may recognize or detect a user's fingerprint pattern.

As shown in FIGS. 6A and 6B, the user's fingerprint is recognized using the light emitted from the light emitting elements of the light emitting element layer EML, and thus fingerprint recognition may be implemented without a separate external light source (e.g., a secondary light source spaced apart from the display device). Accordingly, the thickness of the display device 10 having a fingerprint recognition function may be reduced or decreased, and the manufacturing cost thereof may be reduced.

Figure 7:
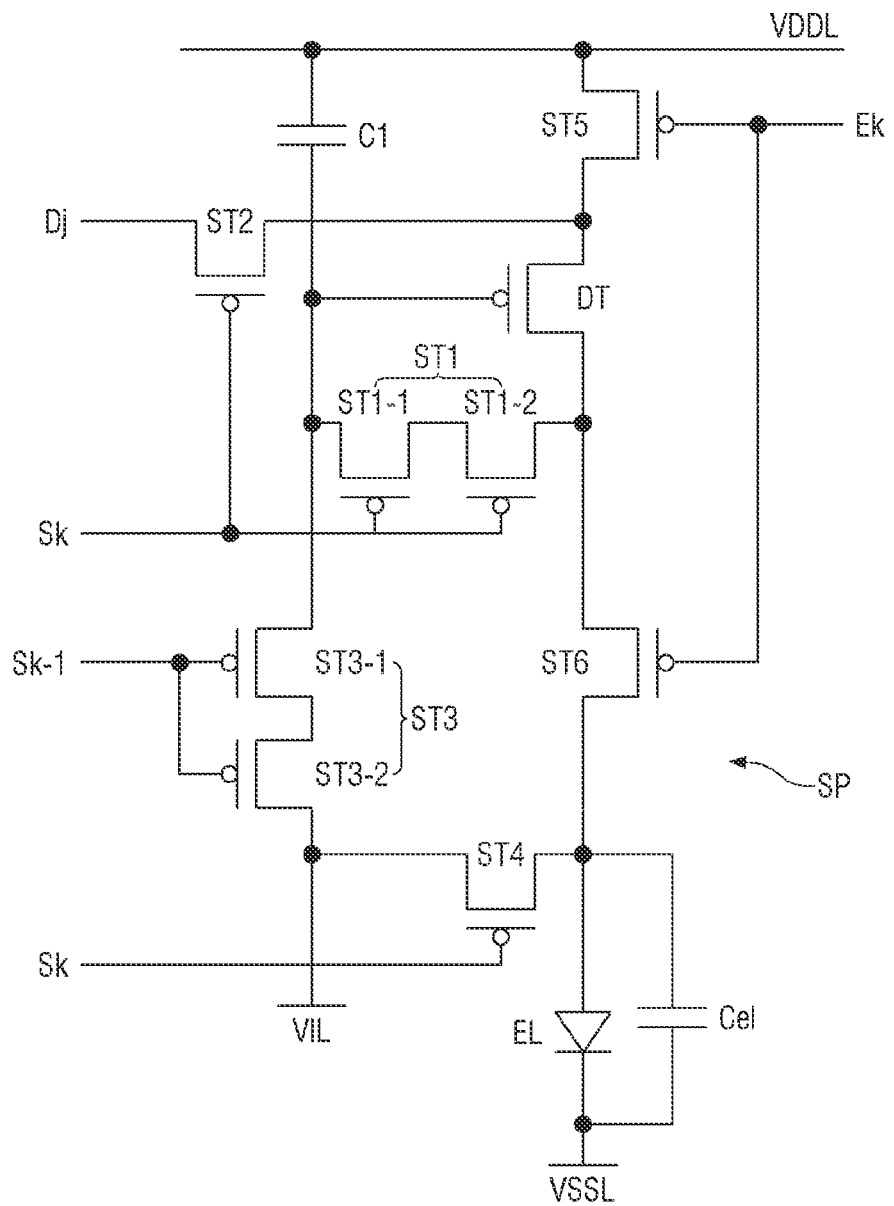
FIG. 7 is a circuit diagram illustrating an example of a sub-pixel of the display device of FIG. 6A.

FIG. 7 is a circuit diagram illustrating an example of a sub-pixel of the display device of FIG. 6A.

Referring to FIG. 7, the sub-pixel SP may be connected to a (k−1)-th (k is a positive integer of 2 or more) scan line Sk−1, a k-th scan line Sk, and a j-th (j is a positive integer) data line Dj. Further, the sub-pixel SP may be connected to a first driving voltage line VDDL to which a first driving voltage is supplied, an initialization voltage line VIL to which an initialization voltage Vini is supplied, and a second driving voltage line VSSL to which a second driving voltage is supplied.

The sub-pixel SP includes a driving transistor DT, a light emitting element LE, switch elements, and a capacitor C1. The switch elements include first to sixth transistors (first transistor ST1, second transistor ST2, third transistor ST3, fourth transistor ST4, fifth transistor ST5, and sixth transistor ST6).

The driving transistor DT may include a gate electrode, a first electrode, and a second electrode. The driving transistor DT controls a drain-source current Ids (hereinafter referred to as "driving current") flowing between the first electrode and the second electrode according to the data voltage applied to the gate electrode. The driving current Ids flowing through a channel of the driving transistor DT is proportional to the square of a difference between the threshold voltage Vth and the voltage Vgs between the gate electrode and the source electrode of the driving transistor DT as shown in Equation 1 below.

$$Ids = k' \times (Vgs - Vth)^2 \quad \text{Equation 1}$$

In Equation 1, k' refers to a proportional coefficient determined by the structure and physical characteristics of the driving transistor, Vgs refers to a gate-source voltage of the driving transistor, and Vth refers to a threshold voltage of the driving transistor.

The light emitting element EL emits light according to the driving current Ids. The amount of light emitted from the light emitting element EL may be proportional to the driving current Ids.

The light emitting element EL may be an organic light emitting diode including an anode electrode, a cathode electrode, and an organic light emitting layer disposed between the anode electrode and the cathode electrode. In one or more embodiments, the light emitting element EL may be an inorganic light emitting element including an anode electrode, a cathode electrode, and an inorganic semiconductor disposed between the anode electrode and the cathode electrode. In one or more embodiments, the light emitting element EL may be a quantum dot light emitting element including an anode electrode, a cathode electrode, and a quantum dot light emitting layer disposed between the anode electrode and the cathode electrode. In one or more embodiments, the light emitting element EL may be a micro light emitting diode chip.

The anode electrode of the light emitting element EL may be connected to the first electrode of the fourth transistor ST4 and the second electrode of the sixth transistor ST6, and the cathode electrode thereof may be connected to the second driving voltage line VSSL. A parasitic capacitance Cel may be formed between the anode electrode and cathode electrode of the light emitting element EL.

The first transistor ST1 may be a dual transistor including the first-first transistor ST1-1 and the first-second transistor ST1-2. The first-first transistor ST1-1 and the first-second transistor ST1-2 are turned on by a scan signal of the k-th scan line Sk to connect the gate electrode and the second electrode of the driving transistor DT. In one or more embodiments, when the first-first transistor ST1-1 and the first-second transistor ST1-2 are turned on, the gate electrode and second electrode of the driving transistor DT are connected, so that the driving transistor DT may be driven as a diode. The gate electrode of the first-first transistor ST1-1 may be connected to the k-th scan line Sk, the first electrode thereof may be connected to the second electrode of the first-second transistor ST1-2, and the second electrode thereof may be connected to the gate electrode of the driving transistor DT. The gate electrode of the first-second transistor ST1-2 may be connected to the k-th scan line Sk, the first electrode thereof may be connected to the second electrode of the driving transistor DT, and the second electrode thereof may be connected to the first electrode of the first-first transistor ST1-1.

The second transistor ST2 is turned on by a scan signal of the k-th scan line Sk to connect the first electrode of the driving transistor DT to the j-th data line Dj. The gate electrode of the second transistor ST2 may be connected to the k-th scan line Sk, the first electrode thereof may be connected to the first electrode of the driving transistor DT, and the second electrode thereof may be connected to the data line Dj.

The third transistor ST3 may be formed as a dual transistor including the third-first transistor ST3-1 and the third-second transistor ST3-2. The third-first transistor ST3-1 and the third-second transistor ST3-2 are turned on by the scan signal of the (k−1)-th scan line Sk−1 to connect the gate electrode of the driving transistor DT to the initialization voltage line VIL. The gate electrode of the driving transistor DT may be discharged to the initialization voltage of the initialization voltage line VIL. The gate electrode of the third-first transistor ST3-1 may be connected to the (k−1)-th scan line Sk−1, the first electrode thereof may be connected to the gate electrode of the driving transistor DT, and the second electrode thereof may be connected to the first electrode of the third-second transistor ST3-2. The gate electrode of the third-second transistor ST3-2 may be connected to the (k−1)-th scan line Sk−1, the first electrode may be connected to the second electrode of the third-first transistor ST3-1, and the second electrode may be connected to the initialization voltage line VIL.

The fourth transistor ST4 is turned on by the scan signal of the k-th scan line Sk to connect the anode electrode of the light emitting element EL to the initialization voltage line VIL. The anode electrode of the light emitting device EL may be discharged to the initialization voltage. The gate electrode of the fourth transistor ST4 may be connected to the k-th scan line Sk, the first electrode thereof is connected to the anode electrode of the light emitting element EL, and the second electrode thereof is connected to the initialization voltage line VIL.

The fifth transistor ST5 is turned on by the light emission control signal of the k-th light emitting line Ek to connect the first electrode of the driving transistor DT to the first driving voltage line VDDL. The gate electrode of the fifth transistor ST5 is connected to the k-th light emitting line Ek, the first electrode thereof is connected to the first driving voltage line VDDL, and the second electrode thereof is connected to the first electrode of the driving transistor DT.

The sixth transistor ST6 is connected between the second electrode of the driving transistor DT and the anode electrode of the light emitting element EL. The sixth transistor ST6 is turned on by the light emission control signal of the k-th light emitting line Ek to connect the second electrode of the driving transistor DT to the anode electrode of the light emitting element EL. The gate electrode of the sixth transistor ST6 is connected to the k-th light emitting line Ek, the first electrode thereof is connected to the second electrode of the driving transistor DT, and the second electrode thereof is connected to the anode electrode of the light emitting element EL. When both the fifth transistor ST5 and the sixth transistor ST6 are turned on, the driving current Ids may be supplied to the light emitting element EL.

The capacitor C1 is formed between the gate electrode of the driving transistor DT and the first driving voltage line VDDL. One electrode of the capacitor C1 may be connected to the gate electrode of the driving transistor DT, and the other electrode thereof may be connected to the first driving voltage line VDDL.

Each of the first to sixth transistors ST1, ST2, ST3, ST4, ST5, ST6, and the driving transistor DT may be formed as a thin film transistor of the thin film transistor layer TFTL. When the first electrode of each of the first to sixth transistors ST1, ST2, ST3, ST4, ST5, ST6, and the driving transistor DT is a source electrode, the second electrode thereof may be a drain electrode. In one or more embodiments, when the first electrode of each of the first to sixth transistors ST1, ST2, ST3, ST4, ST5, ST6, and the driving transistor DT is a drain electrode, the second electrode thereof may be a source electrode.

The active layer of each of the first to sixth transistors ST1, ST2, ST3, ST4, ST5, ST6, and the driving transistor DT may be formed of polysilicon, amorphous silicon, and/or an oxide semiconductor. When the active layer of each of the first to sixth transistors ST1, ST2, ST3, ST4, ST5, ST6, and the driving transistor DT is formed of polysilicon, the process of forming the active layer may be a low-temperature polysilicon (LTPS) process.

Although it is shown in FIG. 4 that the first to sixth transistors ST1, ST2, ST3, ST4, ST5, ST6, and the driving transistor DT are formed as P-type metal oxide semiconductor field effect transistors (MOSFETs), the embodiments of the present disclosure are not limited thereto, and the first to sixth transistors ST1, ST2, ST3, ST4, ST5, ST6, and the driving transistor DT may be formed as N-type MOSFETs.

Figure 8:
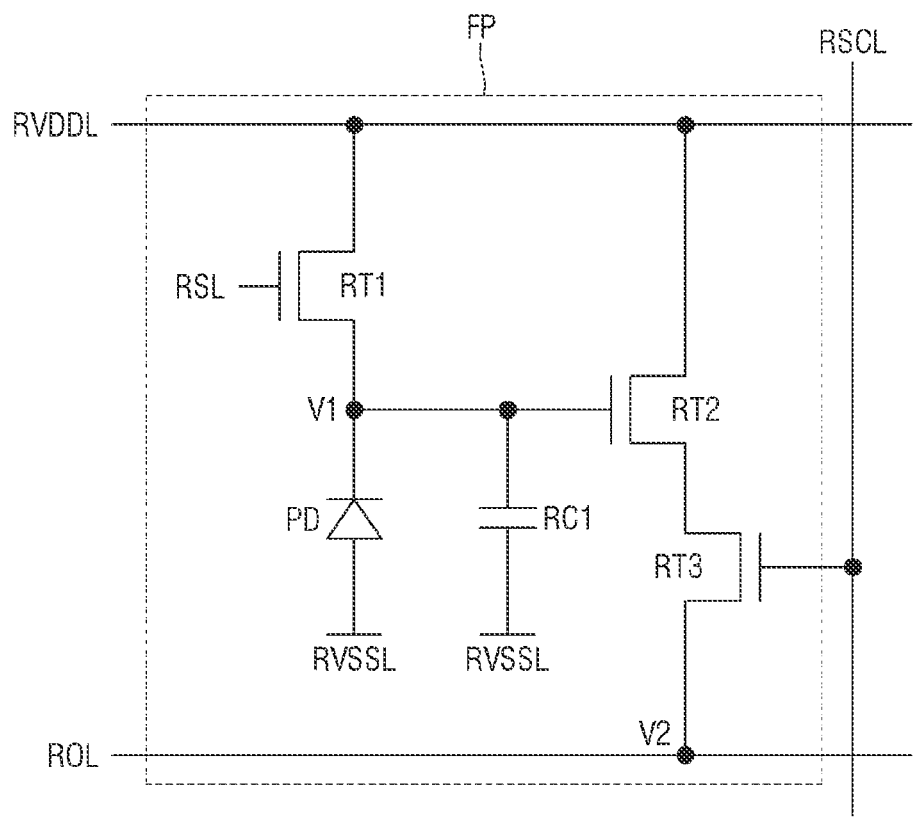
FIG. 8 is a circuit diagram illustrating an example of a sensor pixel of the fingerprint sensor of FIG. 6A.

FIG. 8 is a circuit diagram illustrating an example of a sensor pixel of the fingerprint sensor of FIG. 6A.

Referring to FIG. 8, the sensor pixel FP includes a photo diode PD, first to third sensing transistors (first sensing transistor RT1, second sensing transistor RT2, and third sensing transistor RT3, and a sensing capacitor RC1).

The first sensing transistor RT1 may be a reset transistor that resets the potential V1 of the first electrode of the sensing capacitor RC1 according to the reset signal of the reset signal line RSL. The gate electrode of the first sensing transistor RT1 may be connected to the reset signal line RSL, the source electrode thereof may be connected to the cathode electrode of the photodiode PD and the first electrode of the sensing capacitor RC1, and the drain electrode thereof may be connected to the first sensing driving voltage line RVDDL to which the first sensing driving voltage is applied.

The second sensing transistor RT2 may be an amplification transistor that converts the potential V1 of the first electrode of the sensing capacitor RC1 into a current signal and amplifies the current signal. The gate electrode of the second sensing transistor RT2 may be connected to the cathode electrode of the photodiode PD and the first electrode of the sensing capacitor RC1, the source electrode thereof may be connected to the drain electrode of the third sensing transistor RT3, and the drain electrode thereof may be connected to the first sensing driving voltage line RVDDL.

The third sensing transistor RT3 may be a selection transistor in which the potential V1 of the first electrode of the sensing capacitor RC1 amplified by the second sensing transistor RT2 transmits a current signal to the readout line ROL when a sensing scan signal is applied to the sensing scan line RSCL. The gate electrode of the third sensing transistor RT3 may be connected to the sensing scan line RSCL, the source electrode thereof may be connected to the readout line ROL, and the drain electrode thereof may be connected to the source electrode of the second sensing transistor RT2.

The photodiode PD may include an anode electrode, a PIN semiconductor layer, and a cathode electrode. The anode electrode of the photodiode PD may be connected to the first electrode of the sensing capacitor RC1, and the cathode electrode may be connected to the second sensing driving voltage line RVSSL to which the second sensing driving voltage lower than the first sensing driving voltage is applied. The PIN semiconductor layer of the photodiode PD may include a P-type semiconductor layer connected to the anode electrode, an N-type semiconductor layer connected to the cathode electrode, and an I-type semiconductor layer disposed between the P-type semiconductor layer and the N-type semiconductor layer.

Although it is shown in FIG. 8 that the first to third sensing transistors RT1, RT2, and RT3 are formed as N-type metal oxide semiconductor field effect transistors (MOSFETs), the embodiments of the present disclosure are not limited thereto, and the first to third sensing transistors RT1, RT2, and RT3 may be formed as P-type MOSFETs.

Hereinafter, an operation of the sensor pixel FP shown in FIG. 8 will be described in more detail.

First, when the first sensing transistor RT1 is turned on by the reset signal of the reset signal line RSL, the potential V1 of the first electrode of the sensing capacitor RC1 is reset to the potential of the first sensing driving voltage of the first sense driving voltage line RVDDL.

Second, when light reflected by a user's fingerprint is incident on the photodiode PD, a leakage current may flow in the photodiode PD. The sensing capacitor RC1 may be charged by the leakage current.

As the sensing capacitor RC1 is charged, the potential of the gate electrode of the second sensing transistor RT2 connected to the first electrode of the sensing capacitor RC1 increases. When the potential of the gate electrode of the second sensing transistor RT2 is greater than the threshold voltage, the second sensing transistor RT2 may be turned on.

Third, when a sensing scan signal is applied to the sensing scan line RSCL, the third sensing transistor RT3 may be turned on. When the third sensing transistor RT3 is turned on, a current signal flowing through the second sensing transistor RT2 may be transmitted to the readout line ROL by the potential V1 of the first electrode of the sensing capacitor RC1. Thus, the potential V2 of the readout line ROL increases, and the potential V2 of the readout line ROL may be transmitted to a fingerprint sensor IC. The fingerprint sensor IC may convert the potential V2 of the readout line ROL into a digital signal through an analog-to-digital converter (ADC).

The potential V2 of the readout line ROL is proportional to the first electrode potential V1 of the sensing capacitor RC1 (i.e., the amount of charge charged in the sensing capacitor RC1, and the amount of charge stored in the sensing capacitor RC1 is proportional to the amount of light supplied to the photodiode PD). Therefore, it is possible to determine how much light is incident on the photodiode PD of the sensor pixel FP through the potential V2 of the readout line ROL. Because the fingerprint sensor IC may detect the amount of incident light for each sensor pixel FP, the fingerprint sensor IC may recognize the fingerprint pattern of a user.

Figure 9:
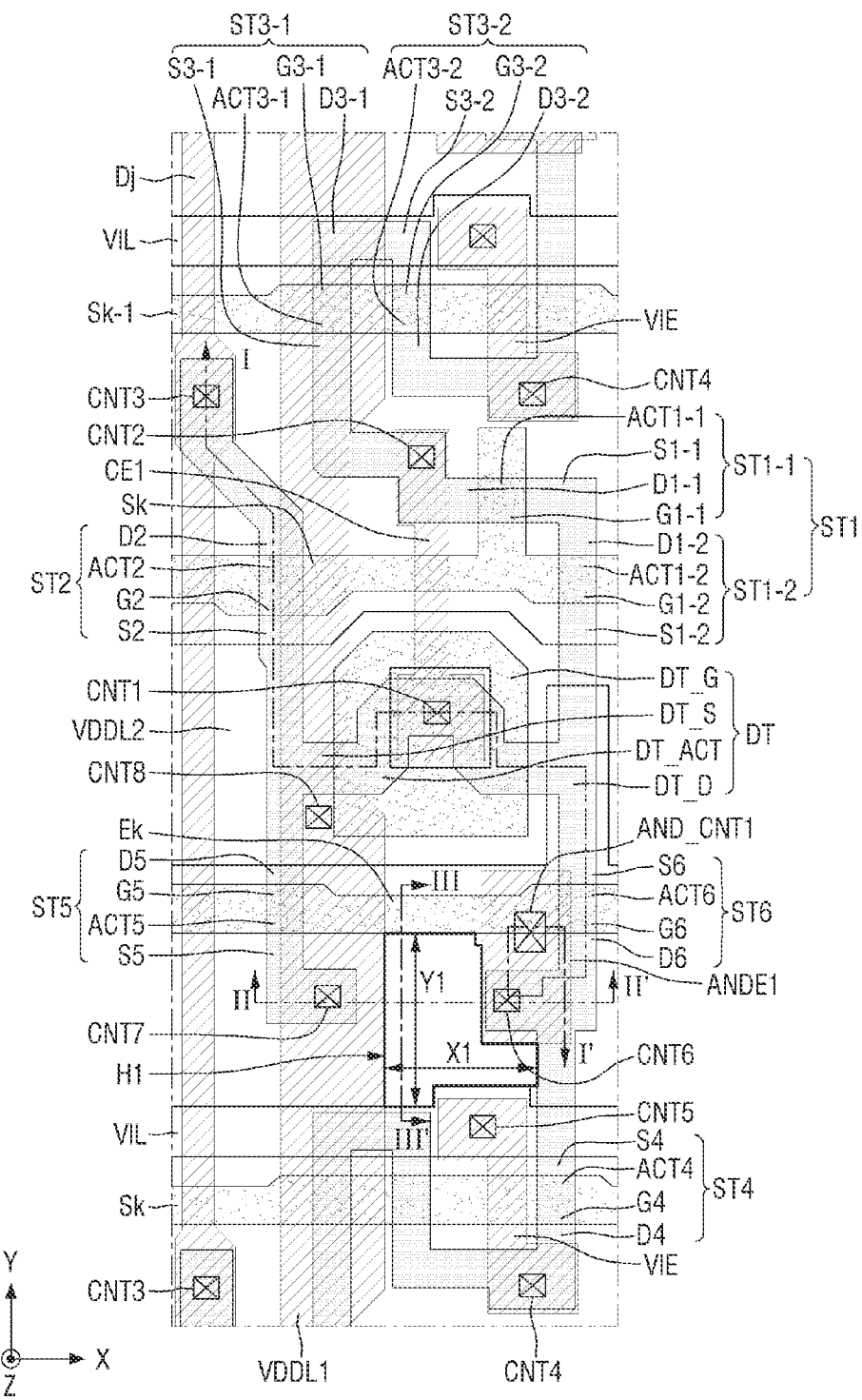
FIG. 9 is a layout view of a thin film transistor of a sub-pixel according to an embodiment.
Figure 10:
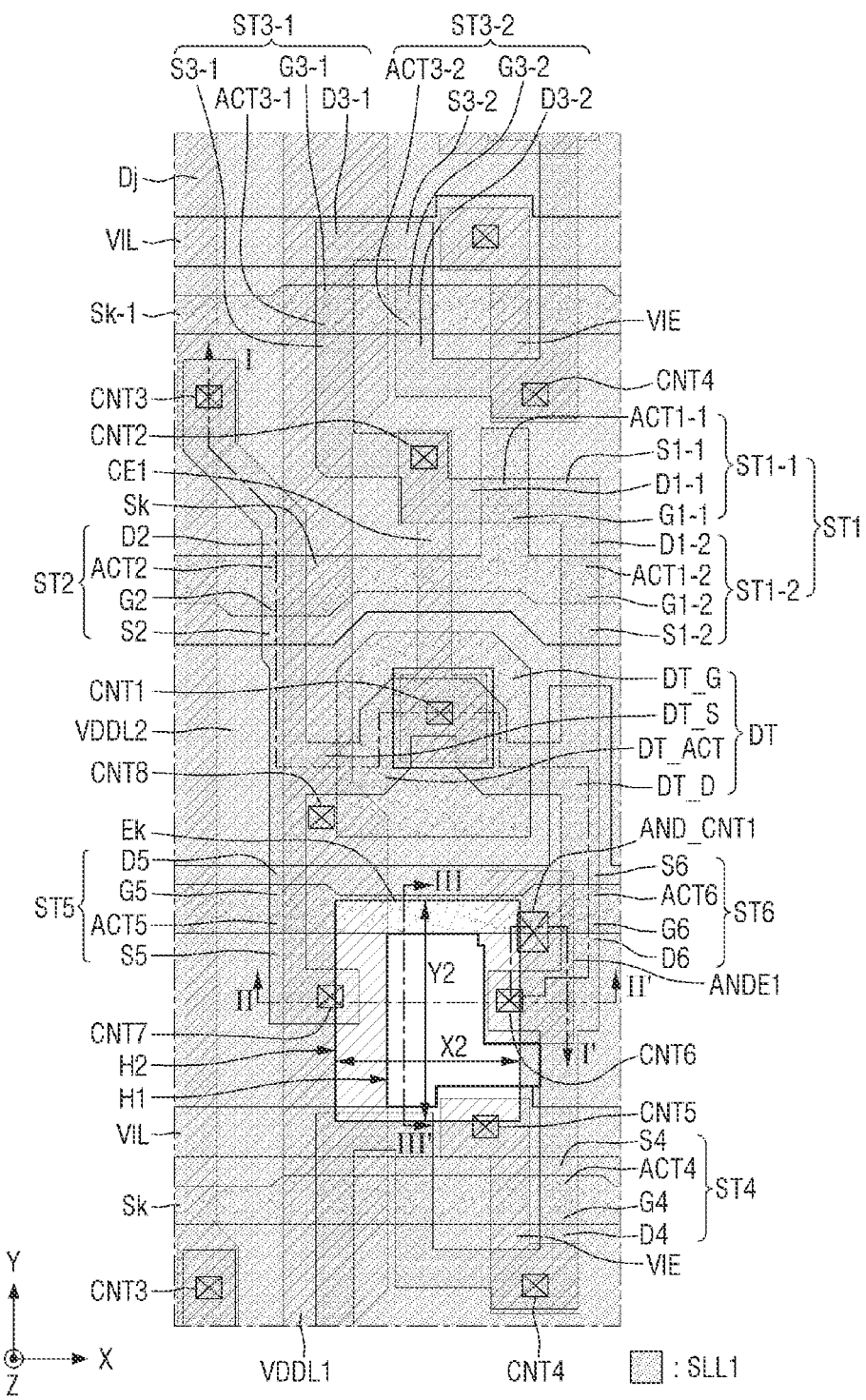
FIG. 10 is a layout illustrating an example of the thin film transistor layer and first light blocking layer of the sub-pixel of FIG. 9.
Figure 11:
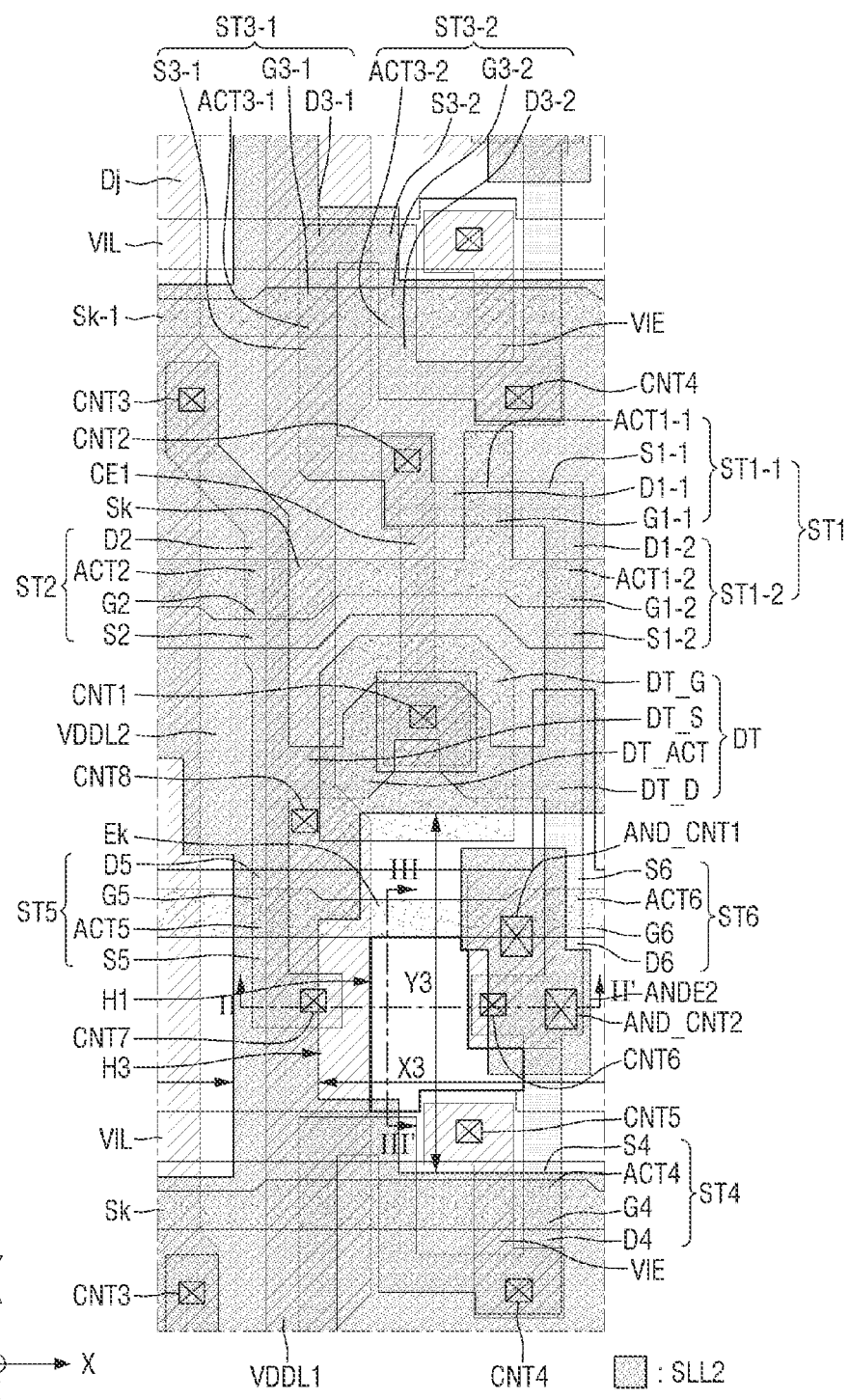
FIG. 11 is a layout illustrating an example of the thin film transistor layer and second light blocking layer of the sub-pixel of FIG. 9.

FIG. 9 is a layout view of a thin film transistor of a sub-pixel according to an embodiment, FIG. 10 is a layout illustrating an example of the thin film transistor layer and first light blocking layer of the sub-pixel of FIG. 9, and FIG. 11 is a layout illustrating an example of the thin film transistor layer and second light blocking layer of the sub-pixel of FIG. 9.

Referring to FIG. 9, the thin film transistor layer TFTL of the sub-pixel SP may include a driving transistor DT, first to sixth transistors ST1 to ST6, a capacitor C1, a first connection electrode CE1, a second connection electrode VIE, and a first anode connection electrode ANDE1.

The sub-pixel SP may overlap the (k−1)-th scan line Sk−1, the k-th scan line Sk, the k-th light emitting line Ek, and the j-th data line Dj, the first driving voltage line VDDL, and the initialization voltage line VIL in in the third direction (Z-axis direction). The sub-pixel SP may be connected to the (k−1)-th scan line Sk−1, the k-th scan line Sk, the j-th data line Dj, and the first driving voltage line VDDL. The k-th scan line Sk−1, the k-th scan line Sk, the k-th light emitting line Ek, and the initialization voltage line VIL may extend in the first direction (X-axis direction). The j-th data line Dj may extend in the second direction (Y-axis direction).

The first driving voltage line VDDL may include a first sub-driving voltage line VDDL1 and a second sub-driving voltage line VDDL2. The first sub-driving voltage line VDDL1 may extend in the second direction (Y-axis direction), and the second sub-driving voltage line VDDL2 may extend in the first direction (X-axis direction). The first sub-driving voltage line VDDL1 may be disposed between the j-th data line Dj and the first connection electrode CE1 in the third direction (X-axis direction). The second sub-driving voltage line VDDL2 may be disposed between the k-th scan line Sk and the k-th light emitting line Ek in the second direction (Y-axis direction). The first sub-driving voltage line VDDL1 may be connected to the second sub-driving voltage line VDDL2 through the eighth contact hole CNT8.

The driving transistor DT may include an active layer DT_ACT, a gate electrode DT_G, a first electrode DT_S, and a second electrode DT_D. The active layer DT_ACT of the driving transistor DT may overlap the gate electrode DT_G of the driving transistor DT in the third direction (Z-axis direction). The gate electrode DT_G may be disposed on the active layer DT_ACT of the driving transistor DT.

The gate electrode DT_G may be connected to the first connection electrode CE1 through the first connection contact hole CNT1. The first connection electrode CE1 may be connected to the second electrode D1-1 of the first-first transistor ST1-1 through the second connection contact hole CNT2. Because the first connection electrode CE1 extends in the second direction (Y-axis direction), the first connection electrode CE1 may cross the k-th scan line Sk.

The first electrode DT_S of the driving transistor DT may be connected to the first electrode S2 of the second transistor ST2. The second electrode DT_D of the driving transistor DT may be connected to the first electrode S1-2 of the first-second transistor ST1-2 and the first electrode S6 of the sixth transistor ST6.

The first transistor ST1 may be formed as a dual transistor. The first transistor ST1 may include a first-first transistor ST1-1 and a first-second transistor ST1-2.

The first-first transistor ST1-1 may include an active layer ACT1-1, a gate electrode G1-1, a first electrode S1-1, and a second electrode D1-1. The gate electrode G1-1 of the first-first transistor ST1-1 is a part of the k-th scan line Sk, and may be an overlapping area of the active layer ACT1-1 of the first-first transistor ST1-1 and the k-th scan line Sk in the third direction (Z-axis direction). The first electrode S1-1 of the first-first transistor ST1-1 may be connected to the second electrode D1-2 of the first-second transistor ST1-2. The second electrode D1-1 of the first-first transistor ST1-1 may be connected to the first connection electrode CE1 through the second connection contact hole CNT2.

The first-second transistor ST1-2 may include an active layer ACT1-2, a gate electrode G1-2, a first electrode S1-2, and a second electrode D1-2. The gate electrode G1-2 of the first-second transistor ST1-2 is a part of the k-th scan line Sk, and may be an overlapping area of the active layer ACT1-2 of the first-second transistor ST1-2 and the k-th scan line Sk in the third direction (Z-axis direction). The first electrode S1-2 of the first-second transistor ST1-2 may be connected to the second electrode DT_D of the driving transistor DT. The second electrode D1-2 of the first-second transistor ST1-2 may be connected to the first electrode S1-1 of the first-first transistor ST1-1.

The second transistor ST2 may include an active layer ACT2, a gate electrode G2, a first electrode S2, and a second electrode D2. The gate electrode G2 of the second transistor ST2 is a part of the k-th scan line Sk, and may be an overlapping area of the active layer ACT2 of the second transistor ST2 and the k-th scan line Sk in the third direction (Z-axis direction). The first electrode S2 of the second transistor ST2 may be connected to the first electrode DT_S of the driving transistor DT. The second electrode D2 of the second transistor ST2 may be connected to the j-th data line Dj through the third contact hole CNT3.

The third transistor ST3 may be formed as a dual transistor. The third transistor ST3 may include a third-first transistor ST3-1 and a third-second transistor ST3-2.

The third-first transistor ST3-1 may include an active layer ACT3-1, a gate electrode G3-1, a first electrode S3-1, and a second electrode D3-1. The gate electrode G3-1 of the third-first transistor ST3-1 is a part of the (k−1)-th scan line Sk−1, and may be an overlapping area of the active layer ACT3-1 of the third-first transistor ST3-1 and the (k−1)-th scan line Sk−1. The first electrode S3-1 of the 3-1 transistor ST3-1 may be connected to the first connection electrode CE1 of the driving transistor DT through the second connection contact hole CNT2. The second electrode D3-1 of the third-first transistor ST3-1 may be connected to the first electrode S3-2 of the third-second transistor ST3-2.

The third-second transistor ST3-2 may include an active layer ACT3-2, a gate electrode G3-2, a first electrode S3-2, and a second electrode D3-2. The gate electrode G3-2 of the third-second transistor ST3-2 is a part of the (k−1)-th scan line Sk−1, and may be an overlapping area of the active layer ACT3-2 of the third-second transistor ST3-2 and the (k−1)-th scan line Sk−1. The first electrode S3-2 of the third-second transistor ST3-2 may be connected to the second electrode D3-1 of the third-first transistor ST3-1. The second electrode D3-2 of the third-second transistor ST3-2 may be connected to the second connection electrode VIE through the fourth contact hole CNT4.

The fourth transistor ST4 may include an active layer ACT4, a gate electrode G4, a first electrode S4, and a second electrode D4. The gate electrode G4 of the fourth transistor ST4 is a part of the kth scan line Sk, and may be an overlapping area of the active layer ACT4 of the fourth transistor ST4 and the k-th scan line Sk. The first electrode S4 of the fourth transistor ST4 may be connected to the first anode connection electrode ANDE1 through the sixth contact hole CNT6. The first anode connection electrode ANDE1 may be connected to the second anode connection electrode ANDE2 through the first anode contact hole AND_CNT1. The second anode connection electrode ANDE2 may be connected to the anode electrode through the second anode contact hole AND_CNT2. The second electrode D4 of the fourth transistor ST4 may be connected to the second connection electrode VIE through the fourth contact hole CNT4. The initialization voltage line VIL may be connected to the second connection electrode VIE through the fifth contact hole CNT5, and the second connection electrode VIE may be connected to the second electrode D3-2 of the third-second transistor ST3-2 and the second electrode D4 of the fourth transistor ST4 through the fourth contact hole CNT4. The second connection electrode VIE may extend in the second direction (Y-axis direction), and may be disposed to cross the (k−1)-th scan line Sk−1.

The fifth transistor ST5 may include an active layer ACT5, a gate electrode G5, a first electrode S5, and a second electrode D5. The gate electrode G5 of the fifth transistor ST5 is a part of the k-th light emission control line Ek, and may be an overlapping area of the active layer ACT5 of the fifth transistor ST5 and the k-th light emission control line Ek. The first electrode S5 of the fifth transistor ST5 may be connected to the first sub-driving voltage line VDDL1 through the seventh contact hole CNT7. The second electrode D5 of the fifth transistor ST5 may be connected to the first electrode DT_S of the driving transistor DT.

The sixth transistor ST6 may include an active layer ACT6, a gate electrode G6, a first electrode S6, and a second electrode D6. The gate electrode G6 of the sixth transistor ST6 is a part of the k-th light emission control line Ek, and may be an overlapping area of the active layer ACT6 of the sixth transistor ST6 and the k-th light emission control line Ek. The first electrode S6 of the sixth transistor ST6 may be connected to the second electrode DT_D of the driving transistor DT. The second electrode D6 of the sixth transistor ST6 may be connected to the anode electrode AND of the light emitting element through the sixth contact hole CNT6.

The thin film transistor layer TFTL may include a first hole H1. As shown in FIG. 9, the first hole H1 may be surrounded by the first sub-driving voltage line VDDL1, the initialization voltage line VIL, the second electrode D6 of the sixth transistor ST6, the first anode connection electrode ANDE1, and the k-th light emitting line Ek. For example, the first hole H1 may be disposed between the first sub driving voltage line VDDL1 and the first anode connection electrode ANDE1 in the first direction (X-axis direction). Further, the first hole H1 may be disposed between the first sub-driving voltage line VDDL1 and the second electrode D6 of the sixth transistor ST6 in the first direction (X-axis direction). Further, the first hole H1 may be disposed between the k-th light emitting line Ek and the initialization voltage line VIL in the second direction (Y-axis direction). The first hole H1 may be an optical hole that serves or functions as a path of light by not arranging elements (e.g., lines or electrodes) that reflect light or interfere with the progress of the light in the thin film transistor layer TFTL.

Meanwhile, the planar shape of the first hole H1 in embodiments of the present disclosure is not limited to that shown in FIG. 9, and the planar shape of the first hole H1 may be formed in various suitable ways according to the arrangement of the lines and electrodes constituting the thin film transistor layer TFTL.

Referring to FIG. 10, the first light blocking layer SLL1 may be disposed under the thin film transistor layer TFTL. The first light blocking layer SLL1 may overlap the driving transistor DT and the first to sixth transistors ST1 to ST6 of the thin film transistor layer TFTL in the third direction (Z-axis direction). As shown in FIG. 10, the first light blocking layer SLL1 may be disposed in an area except for the first hole H1 (e.g., the first hole H1 of the thin film transistor layer TFTL). In one or more embodiments, the light blocking layer SLL1 may include a second hole H2 that overlaps the first hole H1 in the third direction (Z-direction) and the third hole H3.

The first light blocking layer SLL1 may include a second hole H2. The second hole H2 may overlap the first hole H1 of the thin film transistor layer TFTL in the third direction (Z-axis direction). The area of the second hole H2 may be larger (or greater) than the area of the first hole H1. For example, the maximum length X2 of the second hole H2 in the first direction (X-axis direction) may be larger (or greater) than the maximum length X1 of the first hole H1 in the first direction (X-axis direction). The maximum length Y2 of the second hole H2 in the second direction (Y-axis direction) may be larger (or greater) than the maximum length Y1 of the first hole H1 in the second direction (Y-axis direction). The maximum length Y2 of the second hole H2 in the second direction (Y-axis direction) may be larger (or greater) than the maximum length Y1 of the first hole H1 in the second direction (Y-axis direction) by 1 μm (about 1)μm to 5 μm (about 5 μm).

The second hole H2 is a hole penetrating the first light blocking layer SLL1, and may be filled with an insulating film of the thin film transistor layer TFTL (e.g., a buffer film when the thin film transistor layer TFTL is formed on the first light blocking layer SLL1). Therefore, the second hole H2 may be an optical hole that serves as an optical path through which light output from the light emitting element layer EML is reflected by the user's fingerprint and the reflected light L2 proceeds to the fingerprint sensor FPS.

Referring to FIG. 11, the second light blocking layer SLL2 may be disposed above the thin film transistor layer TFTL. The second light blocking layer SLL2 may overlap the driving transistor DT and the first to fifth transistors ST1 to ST5 of the thin film transistor layer TFTL in the third direction (Z-axis direction). The second light blocking layer SLL2 may not overlap the sixth transistor ST6 in the third direction (Z-axis direction).

The second light blocking layer SLL2 may be disposed on the same layer as the second anode connection electrode ANDE2. The second light blocking layer SLL2 may be formed of the same material as the second anode connection electrode ANDE2 by the same process as the second anode connection electrode ANDE2. The second anode connection electrode ANDE2 may be electrically separated from the second light blocking layer SLL2. The second anode connection electrode ANDE2 may be disposed to be spaced apart from the second light blocking layer SLL2. The second anode connection electrode ANDE2 may overlap the sixth transistor ST6 in the third direction (Z-axis direction).

The second light blocking layer SLL2 may include a third hole H3. The third hole H3 may overlap the first hole H1 of the thin film transistor layer TFTL in the third direction (Z-axis direction). The second anode connection electrode ANDE2 may be disposed in the third hole H3. The first anode connection electrode ANDE1 may be connected to the second anode connection electrode ANDE2 through the first anode contact hole AND_CNT1. The second anode connection electrode ANDE2 may be connected to the anode electrode through the second anode contact hole AND_CNT2.

The area of the third hole H3 may be larger (or greater) than the area of the first hole H1. For example, the maximum length X3 of the third hole H3 in the first direction (X-axis direction) may be larger (or greater) than the maximum length X1 of the first hole H1 in the first direction (X-axis direction). The maximum length Y3 of the third hole H3 in the first direction (X-axis direction) may be larger (or greater) than the maximum length Y1 of the first hole H1 in the second direction (Y-axis direction) by 1 µm (about 1 µm) to 5 µm (about 5 µm). The maximum length Y3 of the third hole H3 in the second direction (Y-axis direction) may be larger (or greater) than the maximum length Y2 of the second hole H2 in the second direction (Y-axis direction). The maximum length Y3 of the third hole H3 in the second direction (Y-axis direction) may be larger (or greater) than the maximum length Y1 of the first hole H1 in the second direction (Y-axis direction) by 1 µm (about 1 µm) to 5 µm (about 5 µm).

The third hole H3 is a hole penetrating the second light blocking layer SLL2, and may be filled with an insulating film of the thin film transistor layer TFTL (e.g., a buffer film when the thin film transistor layer TFTL is formed on the second light blocking layer SLL2). Therefore, the third hole H3 may be an optical hole that serves or functions as an optical path through which light output from the light emitting element layer EML is reflected by the user's fingerprint and the reflected light L2 proceeds to the fingerprint sensor FPS.

As shown in FIGS. 9-11, the first hole H1 of the thin film transistor layer TFTL, the second hole H2 of the first light blocking layer SLL1, and the third hole H3 of the second light blocking layer SLL2 may be disposed to overlap each other in the third direction (Z-axis direction), thereby forming a pinhole PH through which the light L2 reflected from a user's fingerprint passes through the sub-pixel SP. Therefore, even when the fingerprint sensor FPS is disposed under the substrate SUB, each of the sensor pixels FP of the fingerprint sensor FPS may detect the light L2 reflected from the user's fingerprint through the pin hole PH.

Figure 12:
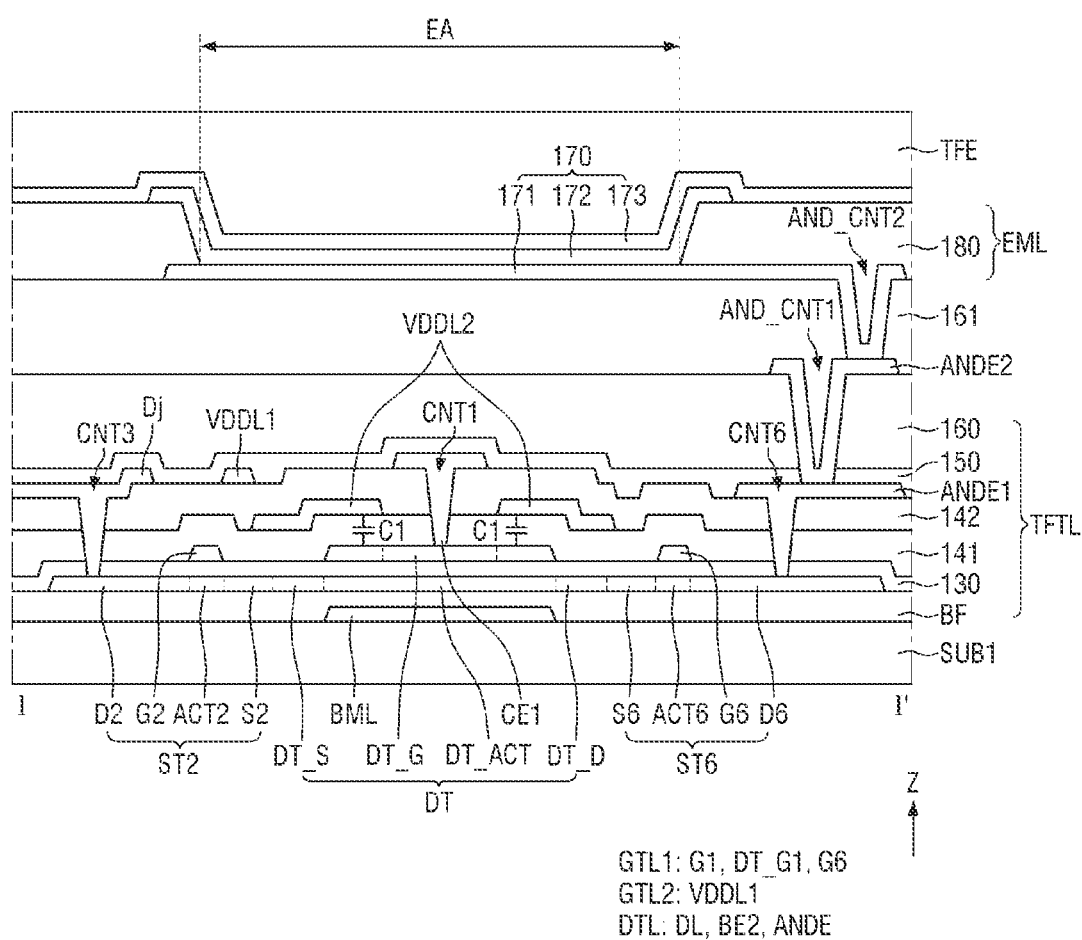
FIG. 12 is a cross-sectional view taken along the line I-I' of FIGS. 9-11.

FIG. 12 is a cross-sectional view taken along the line I-I' of FIGS. 9-11, FIG. 13 is a cross-sectional view taken along the line II-II' of FIGS. 9-11, and FIG. 14 is a cross-sectional view taken along the line III-III' of FIGS. 9-11.

Figure 13:
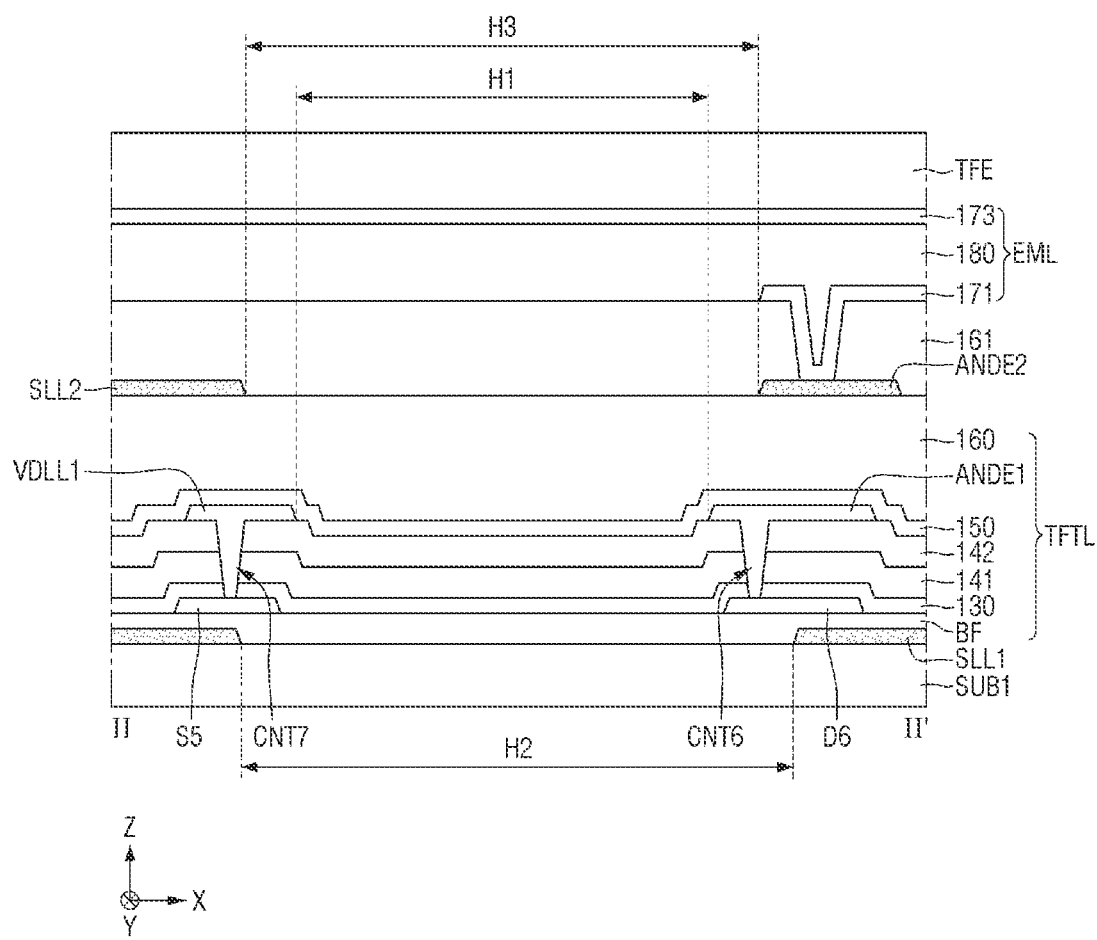
FIG. 13 is a cross-sectional view taken along the line II-II' of FIGS. 9-11.
Figure 14:
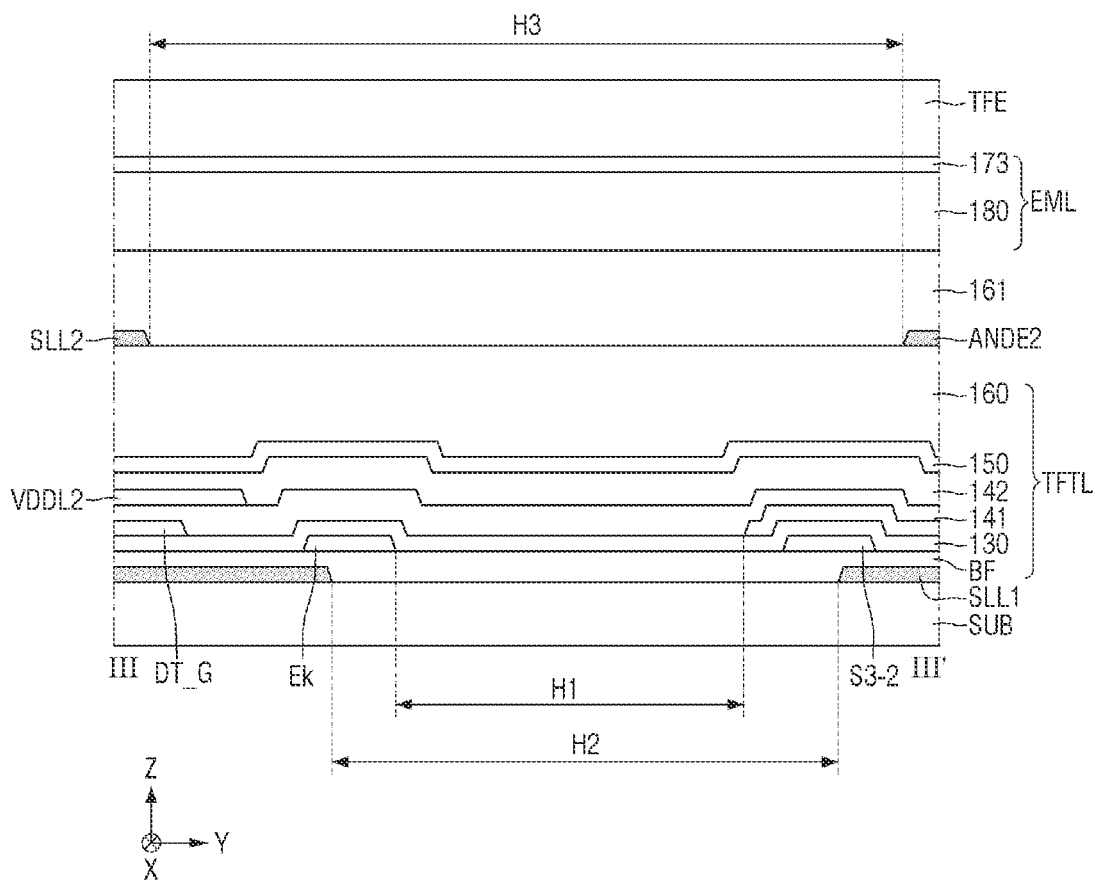
FIG. 14 is a cross-sectional view taken along the line III-III' of FIGS. 9-11.

Referring to FIGS. 12-14, the first light blocking layer SLL1, the thin film transistor layer TFTL, the second light blocking layer SLL2, the light emitting element layer EML, and the encapsulation layer TFE may be formed (e.g., sequentially formed) on the substrate SUB.

The first light blocking layer SLL1 may be formed on one surface of the substrate SUB. The first light blocking layer SLL1 may be formed as a single layer or multiple layer (multilayer) including any one of molybdenum (Mo), aluminum (Al), chromium (Cr), gold (Au), titanium (Ti), nickel (Ni), neodymium (Nd) and copper (Cu), or an alloy thereof. In one or more embodiments, the first light blocking layer SLL1 may be an organic layer including a black pigment.

The thin film transistor layer TFTL includes a buffer film BF, an active layer, a first gate layer, a second gate layer, a data metal layer, a gate insulating film 130, a first interlayer insulating film 141, a second interlayer insulating film 142, a passivation layer 150, and a first organic layer 160.

The buffer film BF may be formed on the first light blocking layer SLL1. The buffer film BF may be formed on one surface of the substrate SUB to protect the thin film transistors and the organic light emitting layer 172 of the light emitting element layer EML from moisture penetrating through the substrate SUB (e.g., moisture penetrating through the substrate SUB at portions of the substrate SUB vulnerable to moisture permeation). The buffer film BF may be formed of a plurality of inorganic films that are alternately laminated. For example, the buffer film BF may be formed as a multilayered film in which two or more inorganic layers of a silicon nitride layer, a silicon oxynitride layer, a silicon oxide layer, a titanium oxide layer, and an aluminum oxide layer are alternately laminated. In one or more embodiments, the buffer film BF may be omitted.

The active layer may be formed on the buffer film BF. The active layer may include not only active layers of a driving transistor DT and first to sixth switching transistors (e.g., first transistor ST1, second transistor ST2, third transistor ST3, fourth transistor ST4, fifth transistor ST5, and sixth transistor ST6) but also source electrodes (e.g., first electrode DT_S, first electrode S1-1, first electrode S1-2, first electrode S2, first electrode S3-1, first electrode S3-2, first electrode S4, first electrode S5, first electrode S6) and drain electrodes (e.g., second electrode DT_D, second electrode D1-1, second electrode D1-2, second electrode D2, second electrode D3-1, second electrode D3-2, second electrode D4, second electrode D5, and second electrode D6). The active layer may include polycrystalline silicon, monocrystalline silicon, low-temperature polycrystalline silicon, amorphous silicon, or an oxide semiconductor. When the active layer includes polycrystalline silicon or an oxide semiconductor, the active layer doped with ions may have conductivity. In other words, the active layer doped with ions may have increased conductivity.

The gate insulating film 130 may be formed on the active layer. The gate insulating film 130 may be formed of an inorganic layer (e.g., a silicon nitride layer, a silicon oxynitride layer, a silicon oxide layer, a titanium oxide layer, or an aluminum oxide layer).

The first gate layer may be formed on the gate insulating film 130. The first gate layer may include not only a gate electrode of the driving transistor DT and gate electrodes (e.g., gate electrode G1-1, gate electrode G1-2, gate electrode G2, gate electrode G3-1, gate electrode G3-2, gate electrode G4, gate electrode G5, gate electrode G6) of the first to sixth switching transistors (e.g., ST1 to ST6) but also scan lines Sk−1 and Sk and a light emitting line Ek. The first gate layer may be formed as a single layer or multiple layers including any one of molybdenum (Mo), aluminum (Al), chromium (Cr), gold (Au), titanium (Ti), nickel (Ni), neodymium (Nd) and copper (Cu), or an alloy thereof.

The first interlayer insulating film 141 may be formed on the first gate layer. The first interlayer insulating film 141 may be formed of an inorganic layer (e.g., a silicon nitride layer, a silicon oxynitride layer, a silicon oxide layer, a titanium oxide layer, or an aluminum oxide layer). The first interlayer insulating film 141 may include a plurality of inorganic layers.

The second gate layer may be formed on the first interlayer insulating film 141. The second gate layer may include an initialization voltage line VIL and a second sub-driving voltage line VDDL2. The first electrode of the capacitor C1 may be a part of the gate electrode DT_G of the driving transistor DT, and the second electrode of the capacitor C1 may be a second sub-driving voltage line VDDL2 overlapping the gate electrode DT_G of the driving transistor DT. The second gate layer may be formed as a single layer or multiple layers including any one of molybdenum (Mo), aluminum (Al), chromium (Cr), gold (Au), titanium (Ti), nickel (Ni), neodymium (Nd) and copper (Cu), or an alloy thereof.

The second interlayer insulating film 142 may be formed on the second gate layer. The second interlayer insulating film 142 may be formed of an inorganic layer (e.g., a silicon nitride layer, a silicon oxynitride layer, a silicon oxide layer, a titanium oxide layer, or an aluminum oxide layer). The second interlayer insulating film 142 may include a plurality of inorganic layers.

The data metal layer may be formed on the second interlayer insulating film 142. The data metal layer may include a first sub-driving voltage line VDDL1, a first connection electrode CE1, a second connection electrode VIE, a first anode connection electrode ANDE1, and a data line Dj. The data metal layer may be formed as a single layer or multiple layers including any one of molybdenum (Mo), aluminum (Al), chromium (Cr), gold (Au), titanium (Ti), nickel (Ni), neodymium (Nd) and copper (Cu), or an alloy thereof.

The first organic layer 160 may be formed on the data metal layer to planarize the step due to the active layer, the first gate layer, the second gate layer, and the data metal layer. The first organic layer 160 may be formed of an acrylic resin, an epoxy resin, a phenolic resin, a polyamide resin, a polyimide resin, or the like.

Meanwhile, the passivation layer 150 may be further formed between the data metal layer and the first organic layer 160. The passivation layer 150 may be formed of an inorganic layer (e.g., a silicon nitride layer, a silicon oxynitride layer, a silicon oxide layer, a titanium oxide layer, or an aluminum oxide layer).

The second light blocking layer SLL2 and the second anode connection electrode ANDE2 may be formed on the first organic layer 160. The second light blocking layer SLL2 and the second anode connection electrode ANDE2 may be formed as a single layer or multiple layers including any one of molybdenum (Mo), aluminum (Al), chromium (Cr), gold (Au), titanium (Ti), nickel (Ni), neodymium (Nd) and copper (Cu), or an alloy thereof.

A second organic layer 161 may be formed on the second light blocking layer SLL2 and the second anode connection electrode ANDE2 to planarize the step. The second organic layer 161 may be formed of an acrylic resin, an epoxy resin, a phenolic resin, a polyamide resin, a polyimide resin, or the like.

Although it is illustrated in FIG. 12 that the driving transistor DT and the first to sixth transistors ST1 to ST6 are formed by a top gate method in which a gate electrode is located over the active layer, the embodiments of the present disclosure are not limited thereto. That is, the driving transistor DT and the first to sixth transistors ST1 to ST6 may formed by a bottom gate method in which a gate electrode is located under the active layer or a double gate method in which a gate electrode is located both over and under the active layer.

The first contact hole CNT1 may be a hole that penetrates through the first interlayer insulating film 141 and the second interlayer insulating film 142 to expose the gate electrode DT_G of the driving transistor DT. The first connection electrode CE1 may be connected to the gate electrode DT_G of the driving transistor DT through the first contact hole CNT1.

The second contact hole CNT2 may be a hole that penetrates through the gate insulating film 130, the first interlayer insulating film 141, and the second interlayer insulating film 142 to expose the second electrode D1-1 of the first-first transistor ST1-1. The first connection electrode CE1 may be connected to the second electrode D1-1 of the first-first transistor ST1-1 through the second contact hole CNT2.

The third contact hole CNT3 may be a hole that penetrates through the gate insulating film 130, the first interlayer insulating film 141, and the second interlayer insulating film 142 to expose the first electrode S2 of the second transistor ST2. The j-th data line Dj may be connected to the first electrode S2 of the second transistor ST2 through the third contact hole CNT3.

The fourth contact hole CNT4 may be a hole that penetrates through the gate insulating film 130, the first interlayer insulating film 141, and the second interlayer insulating film 142 to expose the second electrode D3-2 of the third-second transistor ST3-2 and the second electrode D4 of the fourth transistor ST4. The second connection electrode VIE may be connected to the second electrode D3-2 of the third-second transistor ST3-2 and the second electrode D4 of the fourth transistor ST4 through the fourth contact hole CNT4.

The fifth contact hole CNT5 may be a hole that penetrates through the second interlayer insulating film 142 to expose the initialization voltage line VIL. The second connection electrode VIE may be connected to the initialization voltage line VIL through the fifth contact hole CNT5.

The sixth contact hole CNT6 may be a hole that penetrates through the gate insulating film 130, the first interlayer insulating film 141, and the second interlayer insulating film 142 to expose the second electrode D6 of the sixth transistor ST6. The first anode connection electrode ANDE1 may be connected to the second electrode D6 of the sixth transistor ST6 through the sixth contact hole CNT6.

The seventh contact hole CNT7 may be a hole that penetrates through the gate insulating film 130, the first interlayer insulating film 141, and the second interlayer insulating film 142 to expose the first electrode S5 of the fifth transistor ST5. The first sub-driving voltage line VDDL1 may be connected to the first electrode S5 of the fifth transistor ST5 through the seventh contact hole CNT7.

The eighth contact hole CNT8 may be a hole that penetrates through the second interlayer insulating film 142 to expose the second sub-driving voltage line VDDL2. The first sub-driving voltage line VDDL1 may be connected to the second sub-driving voltage line VDDL2 through the eighth contact hole CNT8.

The first anode contact hole AND_CNT1 may be a hole that penetrates through the passivation layer 150 and the first organic layer 160 to expose the first anode connection electrode ANDE1. The second anode connection electrode ANDE2 may be connected to the first anode connection electrode ANDE1 through the first anode contact hole AND_CNT1.

The second anode contact hole AND_CNT2 may be a hole that penetrates through the second organic layer 161 to expose the second anode connection electrode ANDE2.

The light emitting element layer EML is formed on the thin film transistor layer TFTL. The light emitting element layer EML includes light emitting elements 170 and a pixel defining layer 180.

The light emitting elements 170 and the pixel defining layer 180 are formed on the second organic layer 161. Each of the light emitting elements 170 may include an anode electrode 171, an organic light emitting layer 172, and a cathode electrode 173.

The anode electrode 171 may be formed on the second organic layer 161. The anode electrode 171 may be connected to the second anode connection electrode ANDE2 through the second anode contact hole AND_CNT2.

In the top emission structure in which light is emitted toward the cathode electrode based on the organic light emitting layer 172, the anode electrode 171 may be formed of a high-reflectance metal material such as a laminate structure (Ti/Al/Ti) of aluminum and titanium, a laminate structure (ITO/Al/ITO) of aluminum and ITO, an APC alloy, or a laminate structure (ITO/APC/ITO) of APC alloy and ITO. The APC alloy is an alloy of silver (Ag), palladium (Pd), and copper (Cu).

The pixel defining layer 180 may be formed to partition the anode electrode 171 on the second organic layer 161 to define the emission area EA of each of the sub-pixels SP. The pixel defining layer 180 may be formed to cover the edge of the anode electrode 171. The pixel defining layer 180 may be formed of an acrylic resin, an epoxy resin, a phenolic resin, a polyamide resin, a polyimide resin, or the like.

The emission area of each of the sub-pixels SP refers to an area in which the anode electrode 171, the organic light emitting layer 172, and the cathode electrode 173 are laminated (e.g., sequentially laminated), so that holes from the anode electrode 171 and electrons from the cathode electrode 173 are combined to each other in the organic light emitting layer 172 to emit light.

The organic light emitting layer 172 is formed on the anode electrode 171 and the pixel defining layer 180. The organic light emitting layer 172 may include an organic material to emit light of a set (e.g., predetermined) color. For example, the organic light emitting layer 172 may include a hole transporting layer, an organic material layer, and an electron transporting layer. Among the sub-pixels SP, the organic light emitting layer 172 of the first sub-pixel may emit light of a first color, the organic light emitting layer 172 of the second sub-pixel may emit light of a second color, and the organic light emitting layer 172 of the third sub-pixel may emit light of a third color. In one or more embodiments, the organic light emitting layers 172 of the sub-pixels SP may emit white light, and in this case, a color filter layer of the first color may overlap (e.g., overlap in the thickness direction) the first sub-pixel, a color filter layer of the second color may overlap (e.g., overlap in a thickness direction) the second sub-pixel, and a color filter layer of the third color may overlap (e.g., overlap in a thickness direction) the third sub-pixel. In one or more embodiments, the first color may be red, the second color may be green, and the third color may be blue, but the embodiments of the present disclosure are not limited thereto.

The cathode electrode 173 is formed on the organic light emitting layer 172. The cathode electrode 173 may be formed to cover the organic light emitting layer 172. The cathode electrode 173 may be a common layer commonly formed in the sub-pixels SP. In other words, sub-pixels may share or comprise the same cathode electrode 173. A capping layer may be formed on the cathode electrode 173.

In the top emission structure, the cathode electrode 173 may be formed of a transparent conductive material such as ITO or IZO, which is light-transmittable, or may be formed of a semi-transmissive conductive material such as magnesium (Mg), silver (Ag), or an alloy of magnesium (Mg) and silver (Ag). When the cathode electrode 173 is formed of a semi-transmissive conductive material, light emission efficiency may be increased by micro cavities.

The encapsulation layer TFE may be formed on the light emitting element layer EML. The encapsulation layer TFE may include at least one inorganic layer to prevent or substantially prevent oxygen or moisture from penetrating into the light emitting element layer EML. Further, the encapsulation layer TFE may include at least one organic layer to protect the light emitting element layer EML from foreign matter such as dust.

In one or more embodiments, a substrate, instead of the encapsulation layer TFE, may be disposed on the light emitting element layer EML, and the space between the light emitting element layer EML and the substrate may be empty in a vacuum state or may be provided with a filling film.

Meanwhile, in FIGS. 12-14, for convenience of description, description of the sensor electrode layer SENL is not repeated.

Figure 15:
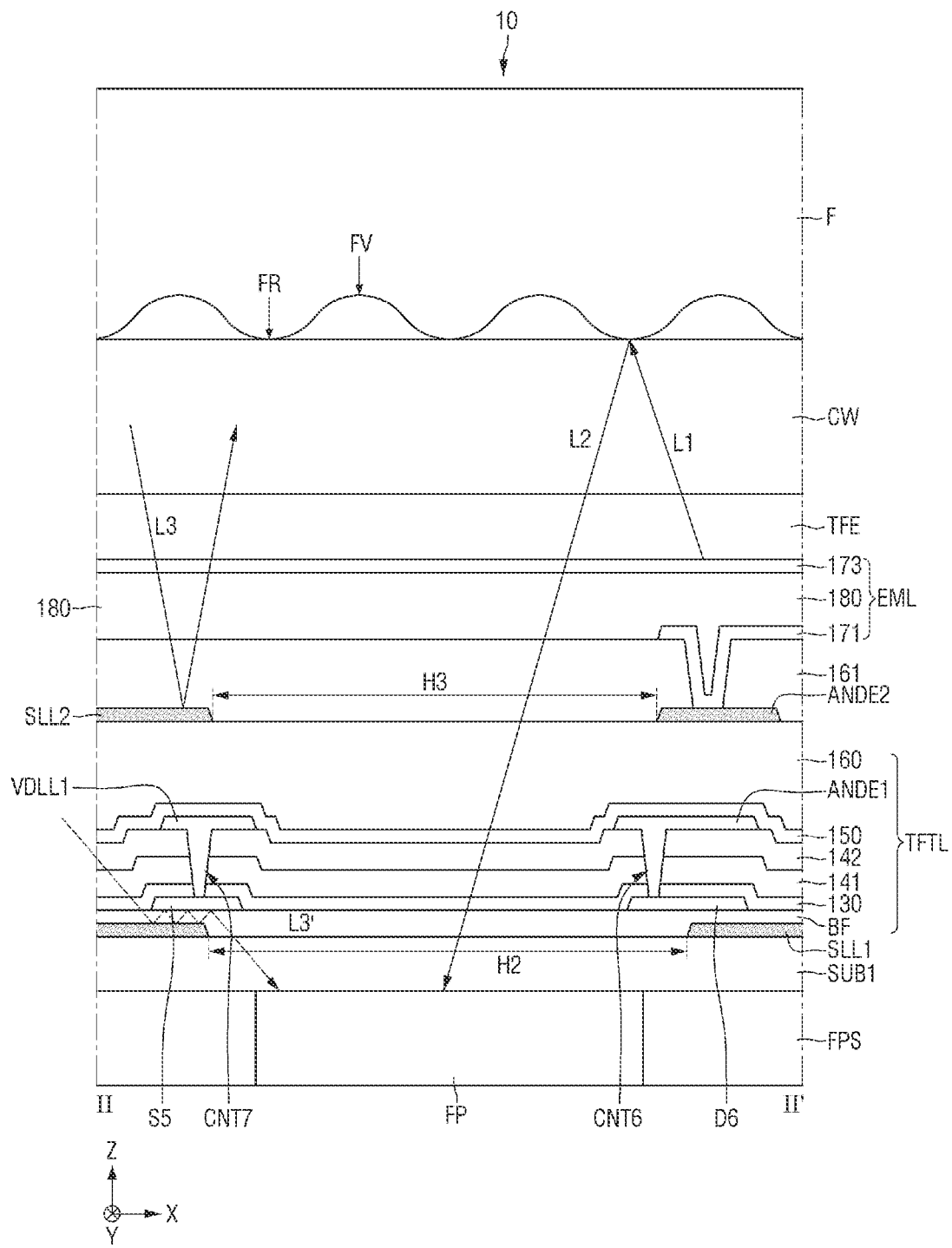
FIG. 15 is an exemplary cross-sectional view schematically illustrating an optical path in which a user's fingerprint is recognized in FIG. 13.

FIG. 15 is an exemplary cross-sectional view schematically illustrating an optical path in which a user's fingerprint is recognized in FIG. 13.

As shown in FIG. 15, when the user's finger F contacts the display device 10, the light L1 output from the organic light emitting layer 172 may be reflected from the ridge FR or valley FV of the user's finger F. The light L2 reflected from the ridge FR or valley FV of the user's finger F may pass through the first hole H1, the second hole H2, and the third hole H3, and may be incident on the sensor pixel FP of the fingerprint sensor FPS. Therefore, the sensor pixels FP of the fingerprint sensor FPS may recognize the fingerprint pattern of the user by sensing the incident light.

Further, the second light blocking layer SLL2 may reflect ambient light L3 such as external light instead of the light L2 reflected by the finger F. Thus, ambient light L3 (e.g., external light incident on the thin film transistor layer TFTL), may be reflected from at least two layers of the active layer, the first gate metal layer, the second gate metal layer, the data metal layer, and the first light blocking layer SLL1 to prevent or substantially prevent the reflected ambient light L3' from being incident on the sensor pixel FP of the fingerprint sensor FPS. Therefore, the accuracy of fingerprint pattern recognition of the fingerprint sensor FPS may be improved.

Meanwhile, as shown in FIG. 15, when the first light blocking layer SLL1 is formed in the entire area except the second hole H2 (e.g., the first light blocking layer SLL1 defines the second hole H2), parasitic capacitance formed between the first light blocking layer SLL1 and the active layer, parasitic capacitance formed between the first light blocking layer SLL1 and the first gate metal layer, parasitic capacitance formed between the first light blocking layer SLL1 and the second gate metal layer, and parasitic capacitance formed between the first light blocking layer SLL1 and the data metal layer may increase. Due to the parasitic capacitance, load of the scan lines applying scan signals, load of the light emitting lines applying light emission signals, load of the initialization voltage line applying an initialization voltage, and load of the data line applying a data voltage may increase. When the load of the scan lines, the load of the light emitting lines, the load of the initialization voltage line, and the load of the data line increase, the data voltage charging time of each of the sub-pixels SP may increase, and the threshold voltage compensation time of the driving transistor DT of each of the sub-pixels SP may increase.

Figure 16:
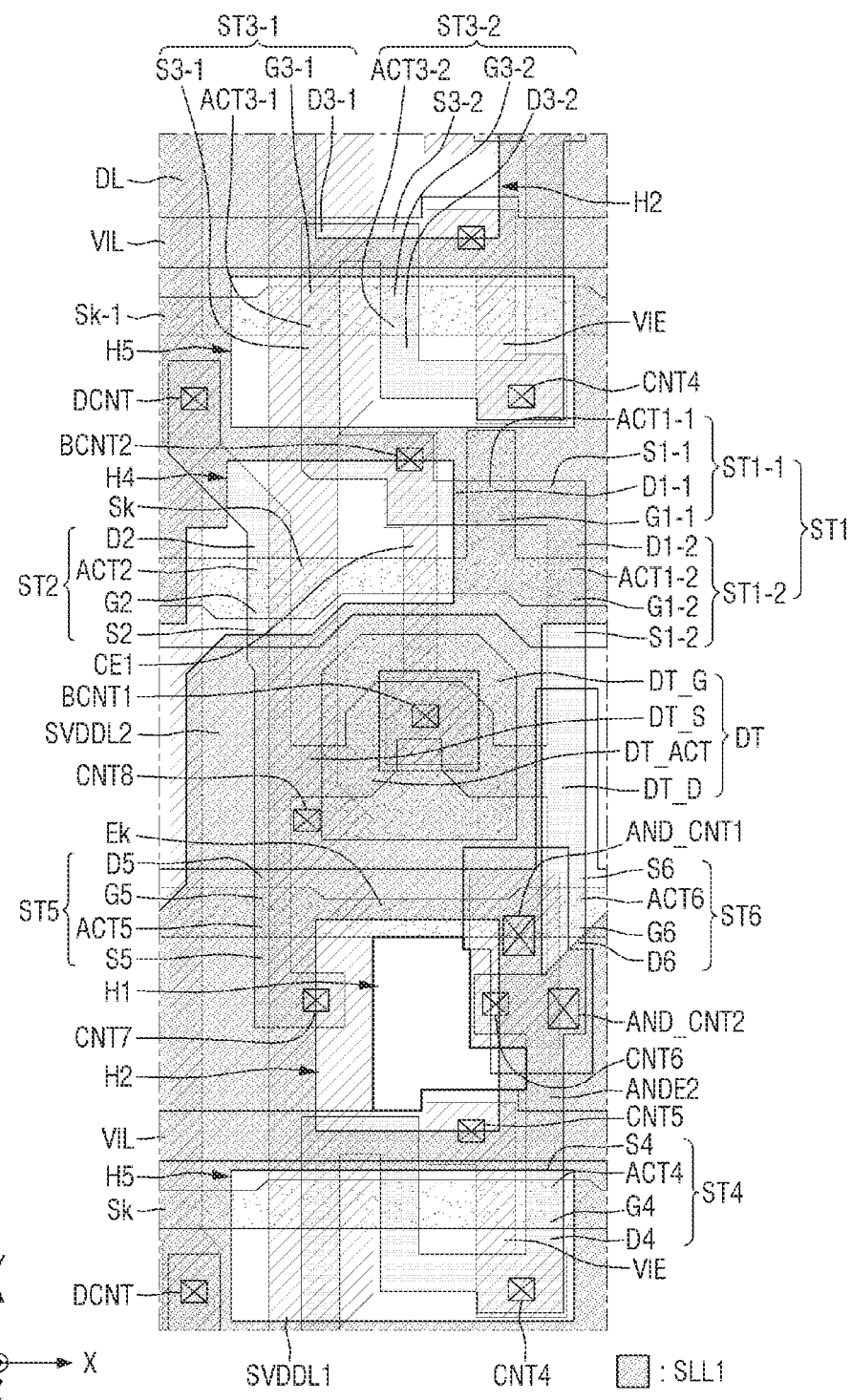
FIG. 16 is a layout view illustrating another example of the thin film transistor layer and first light blocking layer of the sub-pixel of FIG. 9.

FIG. 16 is a plan view illustrating another example of the first light blocking layer disposed on the thin film transistor layer of the sub-pixel of FIG. 9.

The embodiment of FIG. 16 is different from the embodiment of FIG. 10 in that the first light blocking layer SLL1 does not overlap a part of the second transistor ST2, a part of the third transistor ST3, a part of the fourth transistor ST4, and a part of the sixth transistor ST6 in the third direction (Z-axis direction).

Referring to FIG. 16, the first light blocking layer SLL1 may overlap the driving transistor DT, the first transistor ST1, and the fifth transistor ST5 in the third direction (Z-axis direction). In this case, the light incident on or directed toward the active layer DT_ACT of the driving transistor DT, the active layers ACT1-1 and ACT1-2 of the first transistor ST1, and the active layer of the fifth transistor ST5 through the substrate may be blocked or substantially blocked by the first light blocking layer SLL1.

The first light blocking layer SLL1 may further include a fourth hole H4 and a fifth hole H5 in addition to the second hole H2. In one or more embodiments, the second hole H2, the fourth hole H4, and the fifth hole H5 are spaced apart from each other in a plan view. In other words, the second hole H2, the fourth hole H4, and the fifth hole H5 do not overlap each other in the third direction (Z-axis direction). Because the second hole H2 is substantially the same as that described with reference to FIG. 10, a description of the second hole H2 will be not repeated.

The fourth hole H4 may overlap the active layer ACT2 of the second transistor T2, the gate electrode G2, a part of the first electrode S2, and a part of the second electrode D2 in the third direction (Z-axis direction). Further, the fourth hole H4 may overlap a part of the k-th scan line Sk, a part of the first connection electrode CE1, and a part of the j-th data line Dj in the third direction (Z-axis direction). The active layer ACT2 of the second transistor T2, the gate electrode G2, a part of the first electrode S2, and a part of the second electrode D2 may not overlap the first light blocking layer SLL1 in the third direction (Z-axis direction).

The fifth hole H5 may overlap the active layer ACT3-1 of the third-first transistor ST3-1, the gate electrode G3-1, a part of the first electrode S3-1, and a part of the second electrode D3-1 in the third direction (Z-axis direction). Further, the fifth hole H5 may overlap the active layer ACT3-2 of the third-second transistor ST3-2, the gate electrode G3-2, a part of the first electrode S3-2, and a part of the second electrode D3-2 in the third direction (Z-axis direction). Further, the fifth hole H5 may overlap the active layer ACT4 of the fourth transistor ST4, the gate electrode G4, a part of the first electrode S4, and a part of the second electrode D4 in the third direction (Z-axis direction). Further, the fifth hole H5 may overlap a part of the second connection electrode VIE and a part of the (k−1)-th scan line Sk−1 in the third direction (Z-axis direction).

The active layer ACT3-1 of the third-first transistor ST3-1, the gate electrode G3-1, a part of the first electrode S3-1, and a part of the second electrode D3-1 may overlap the first light blocking layer SLL1 in the third direction (Z-axis direction). The active layer ACT3-2 of the third-second transistor ST3-2, the gate electrode G3-2, a part of the first electrode S3-2, and a part of the second electrode D3-2 may overlap the first light blocking layer SLL1 in the third direction (Z-axis direction). The active layer ACT4 of the fourth transistor ST4, the gate electrode G4, a part of the first electrode S4, and a part of the second electrode D4 may overlap the first light blocking layer SLL1 in the third direction (Z-axis direction). A part of the second connection electrode VIE and a part of the (k−1)-th scan line Sk−1 may overlap the first light blocking layer SLL1 in the third direction (Z-axis direction).

As shown in FIG. 16, the first light blocking layer SLL1 may include not only the second hole H2 for forming the pin hole PH serving as a light path but also the fourth hole H4 and fifth hole H5 for reducing the load of the scan lines, the load of the light emitting lines, the load of the initialization voltage line, and the load of the data line. That is, in the fourth hole H4 and fifth hole H5, a part of the k-th scan line Sk, a part of the j-th data line Dj, a part of the second connection electrode VIE, and a part of the (k−1)-th scan line Sk−1 may overlap the first light blocking layer SLL1 in the third direction (Z-axis direction). Thus, because the overlapping area between the scan lines and the first light blocking layer, the overlapping area between the initialization voltage line and the first light blocking layer SLL1, and the overlapping area between the data lines and the first light blocking layer SLL1 may be reduced, the load of the scan lines, the load of the initialization voltage line, and the load of the data line may be reduced.

Figure 17:
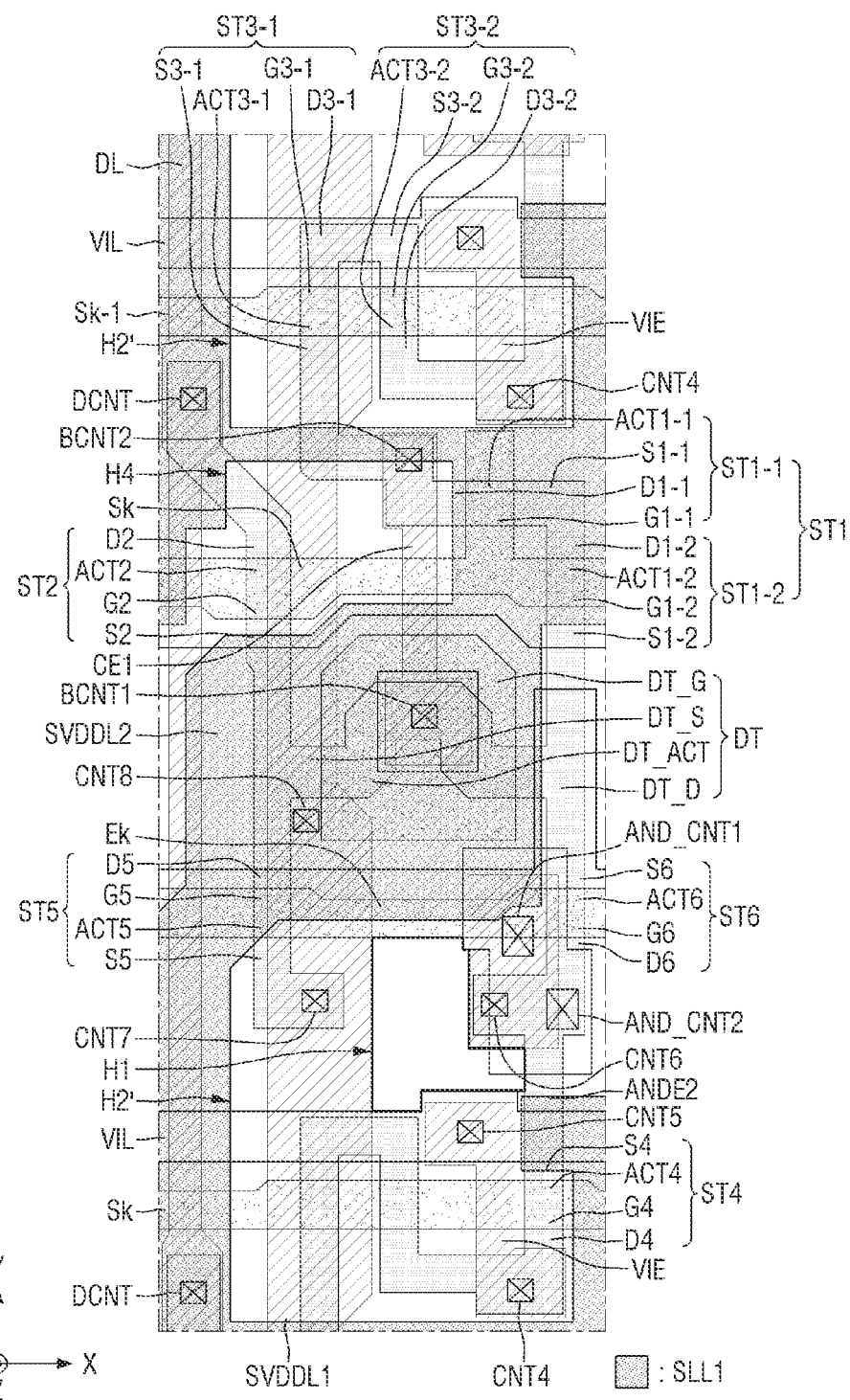
FIG. 17 is a layout view illustrating another example of the thin film transistor layer and first light blocking layer of the sub-pixel of FIG. 9.

FIG. 17 is a plan view illustrating another example of the first light blocking layer disposed on the thin film transistor layer of the sub-pixel of FIG. 9. FIG. 17 illustrates a thin film transistor layer and a first light blocking layer of a sub-pixel SP that do not include the pin hole PH.

The embodiment of FIG. 17 is different from the embodiment of FIG. 10 in that the first light blocking layer SLL1 does not overlap a part of the second transistor ST2, the third transistor ST3, a part of the fourth transistor ST4, and the sixth transistor ST6 in the third direction (Z-axis direction).

Referring to FIG. 17, the first light blocking layer SLL1 may overlap the driving transistor DT, the first transistor ST1, and a part of the fifth transistor ST5 in the third direction (Z-axis direction). In this case, the light incident on or directed toward the active layer DT_ACT of the driving transistor DT, the active layer ACT1 of the first transistor ST1, and the active layer of the fifth transistor ST5 through the substrate SUB may be blocked or substantially blocked by the first light blocking layer SLL1.

The first light blocking layer SLL1 may include a second hole H2'. In one or more embodiments, the second hole H2' and the fourth hole H4 are spaced apart from each other in a plan view. For example, the second hole H2' and the fourth hole H4 do not overlap in the third direction (Z-axis direction). In one or more embodiments, the second hole H2' may overlap the active layer ACT2 of the second transistor T2, the gate electrode G2, a part of the first electrode S2, and a part of the second electrode D2 in the third direction (Z-axis direction). Further, the second hole H2' may overlap the active layer ACT3-1 of the third-first transistor T3-1, the gate electrode G3-1, a part of the first electrode S3-1, and a part of the second electrode D3-1 in the third direction (Z-axis direction). Further, the second hole H2' may overlap the active layer ACT3-2 of the third-second transistor T3-2, the gate electrode G3-2, the first electrode S3-2, and the second electrode D3-2 in the third direction (Z-axis direction). Further, the second hole H2' may overlap the active layer ACT4 of the fourth transistor T4, the gate electrode G4, a part of the first electrode S4, and a part of the second electrode D4 in the third direction (Z-axis direction). Further, the second hole H2' may overlap the active layer ACT6 of the sixth transistor T6, the gate electrode G6, the first electrode S6, and the second electrode D6 in the third direction (Z-axis direction). Further, the second hole H2' may overlap a part of the k-th scan line Sk, a part of the first connection electrode CE1, and a part of the j-th data line Dj in the third direction (Z-axis direction). Further, the second hole H2' may overlap a part of the second connection electrode VIE and the (k−1)-th scan line Sk−1 in the third direction (Z-axis direction).

The active layer ACT2 of the second transistor T2, the gate electrode G2, a part of the first electrode S2, and a part of the second electrode D2 may not overlap the first light blocking layer SLL1 in the third direction (Z-axis direction). The active layer ACT3-1 of the third-first transistor T3-1, the gate electrode G3-1, a part of the first electrode S3-1, and a part of the second electrode D3-1 may not overlap the first light blocking layer SLL1 in the third direction (Z-axis direction). The active layer ACT3-2 of the third-second transistor T3-2, the gate electrode G3-2, the first electrode S3-2, and the second electrode D3-2 may not overlap the first light blocking layer SLL1 in the third direction (Z-axis direction). The active layer ACT4 of the fourth transistor T4, the gate electrode G4, a part of the first electrode S4, and a part of the second electrode D4 may not overlap the first light blocking layer SLL1 in the third direction (Z-axis direction). The active layer ACT6 of the sixth transistor T6, the gate electrode G6, the first electrode S6, and the second electrode D6 may not overlap the first light blocking layer SLL1. A part of the k-th scan line Sk, a part of the first connection electrode CE1, and a part of the j-th data line Dj may not overlap the first light blocking layer SLL1 in the third direction (Z-axis direction). A part of the second connection electrode VIE and the (k−1)-th scan line Sk−1 may not overlap the first light blocking layer SLL1 in the third direction (Z-axis direction).

As shown in FIG. 17, in the second hole H2', a part of the k-th scan line Sk, a part of the j-th data line Dj, a part of the second connection electrode VIE, and a part of the (k-1)th scan line Sk−1 may not overlap the first light blocking layer SLL1 in the third direction (Z-axis direction). Therefore, because the overlapping area between the scan lines and the first light blocking layer, the overlapping area between the initialization voltage line and the first light blocking layer SLL1, and the overlapping area between the data lines and the first light blocking layer SLL1 may be reduced, the load of the scan lines, the load of the initialization voltage line, and the load of the data line may be reduced.

Figure 18:
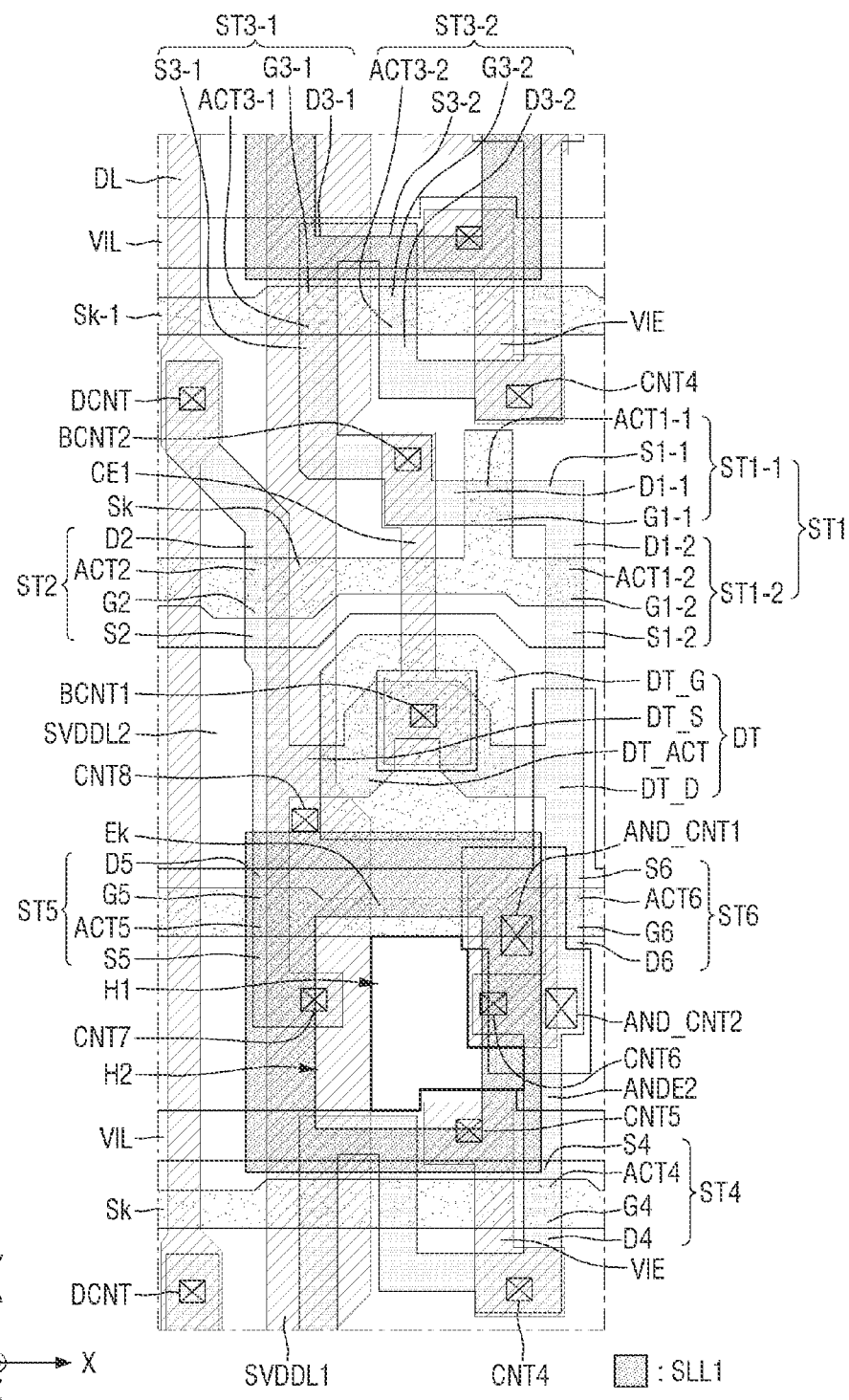
FIG. 18 is a layout view illustrating another example of the thin film transistor layer and first light blocking layer of the sub-pixel of FIG. 9.

FIG. 18 is a plan view illustrating another example of the first light blocking layer disposed on the thin film transistor layer of the sub-pixel of FIG. 9.

The embodiment of FIG. 18 is different from the embodiment of FIG. 10 in that the first light blocking layer SLL1 has a frame or window frame shape that partitions the second hole H2 on the plane. In one or more embodiments, the first light blocking layer SLL1 encircles the second hole H2.

Although it is illustrated in FIG. 18 that the first light blocking layer SLL1 has a rectangular frame on the plane, the frame shape of the first light blocking layer SLL1 in embodiments of the present disclosure is not limited thereto. The first light blocking layer SLL1 may have a polygonal, circular, or oval frame other than or instead of the rectangular frame on the plane.

The first light blocking layer SLL1 may overlap a part of the fifth transistor ST5 in the third direction (Z-axis direction). For example, as shown in FIG. 18, the first light blocking layer SLL1 may overlap the active layer ACT5 of the fifth transistor ST5, the gate electrode G5, a part of the source electrode S5, and the drain electrode D5 in the third direction (Z-axis direction).

As shown in FIG. 18, the first light blocking layer SLL1 may overlap a part of the k-th light emitting line Ek and a part of the initialization voltage line VIL, and may not overlap the (k−1)-th scan line Sk−1, the k-th scan line Sk, and the j-th data line Dj in the third direction (Z-axis direction). Therefore, because the overlapping area between the scan lines Sk−1 and Sk and the first light blocking layer SLL1, the overlapping area between the initialization voltage line VIL and the first light blocking layer SLL1, and the overlapping area between the data lines Dj and the first light blocking layer SLL1 may be reduced, the load of the scan lines, the load of the initialization voltage line, and the load of the data line may be reduced.

Further, as shown in FIG. 18, because the first light blocking layer SLL1 is disposed only under a part of the thin film transistor layer TFTL, the thin film transistor layer TFTL of a defective sub-pixel may be repaired through the lower portion of the substrate SUB.

Figure 19:
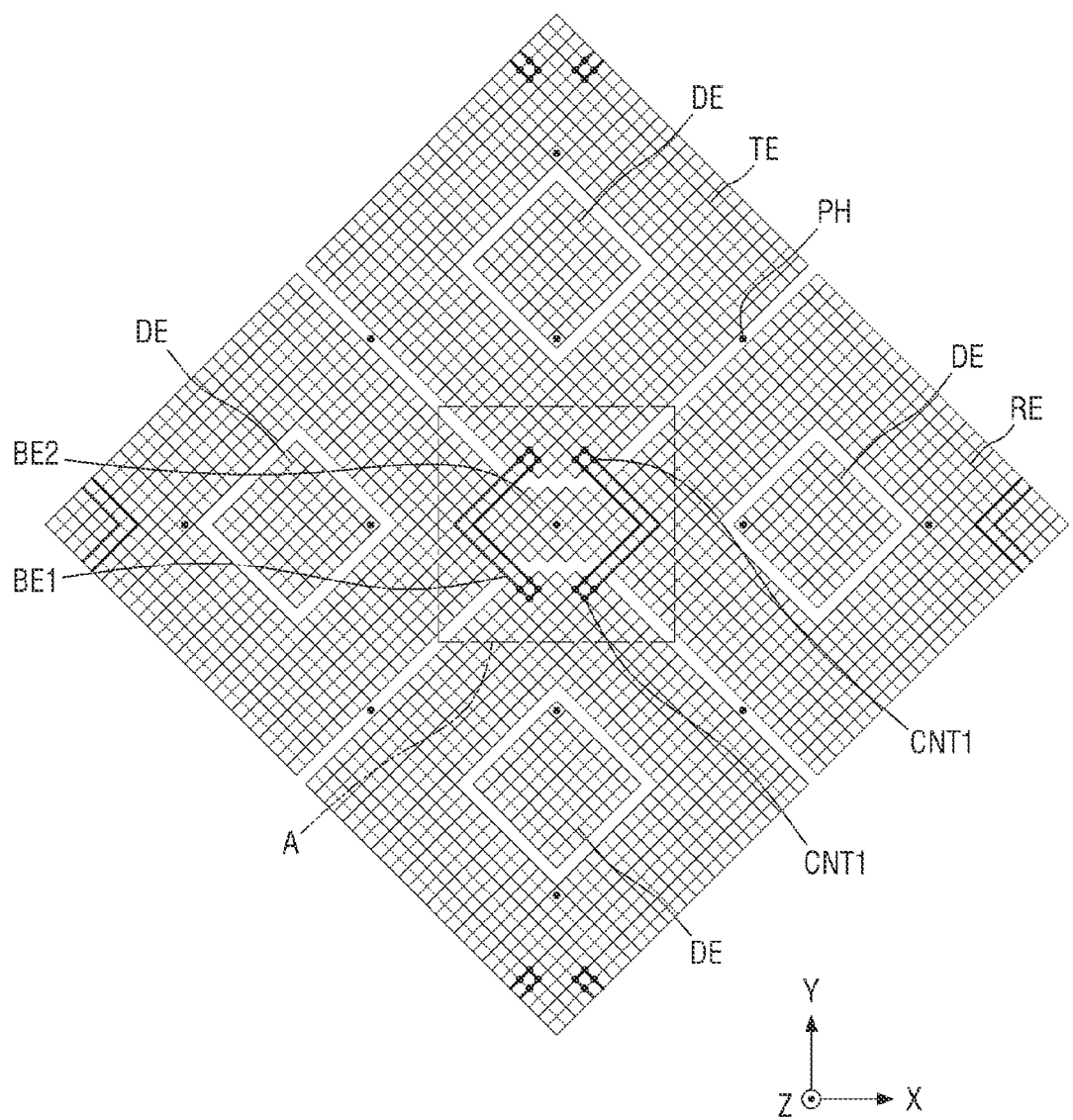
FIG. 19 is a schematic plan view of a fingerprint recognition area of a display device according to an embodiment.
Figure 20:
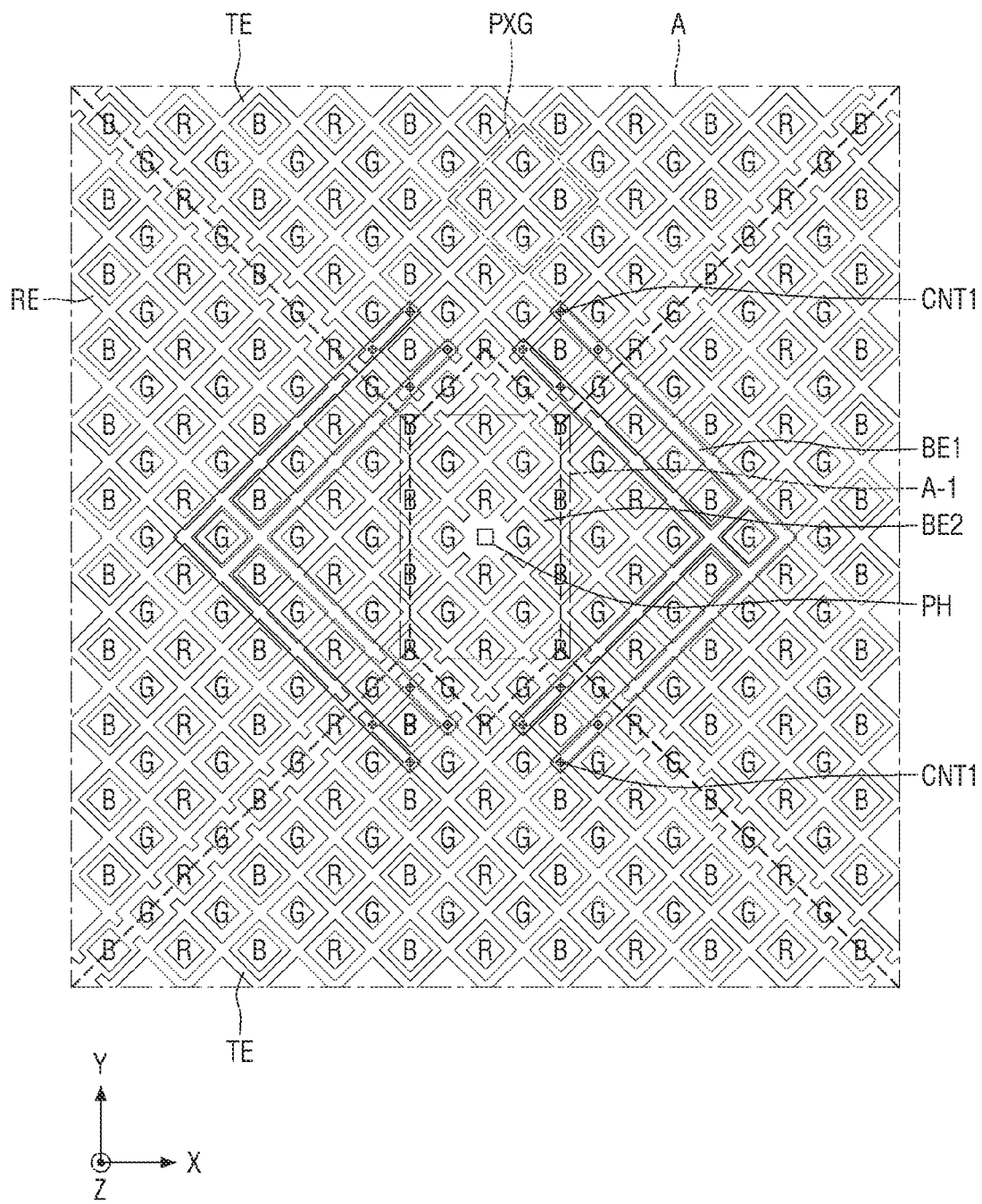
FIG. 20 is a schematic plan view of first connection portions of FIG. 19.
Figure 21:
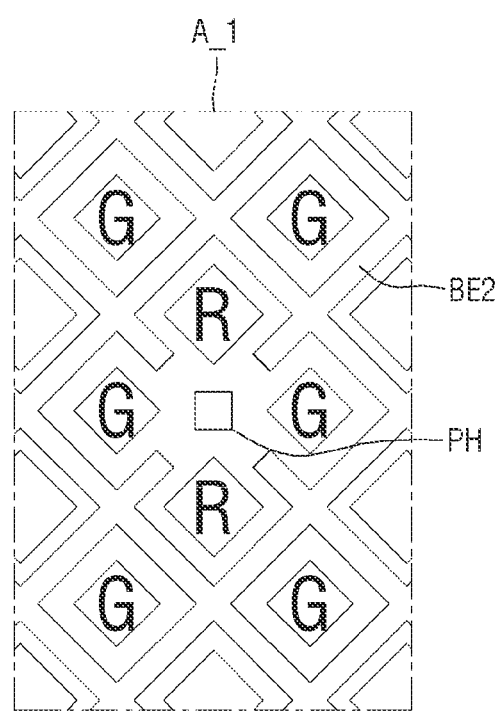
FIG. 21 is a schematic plan view of a pinhole area of FIG. 19.

FIG. 19 is a schematic plan view of a fingerprint recognition area of a display device according to an embodiment, FIG. 20 is a schematic plan view of first connection portions of FIG. 19, and FIG. 21 is a schematic plan view of a pinhole area of FIG. 19.

FIGS. 19 and 20 illustrate sensor electrodes TE and RE of a sensing electrode layer SENL disposed on the uppermost surface of the display panel 100. FIGS. 19 and 20 illustrate that the sensor electrodes of the sensor electrode layer SENL include mutual capacitive driving electrodes TE and sensing electrodes RE. For convenience of description, FIG. 19 shows only two sensing electrodes RE adjacent to the sensing electrode layer SENL in the first direction (X-axis direction) and two driving electrodes TE adjacent to the sensing electrode layer SENL in the second direction (Y-axis direction). FIG. 20 shows an example of area A in FIG. 19. FIG. 21 shows an example of area A-1 in FIG. 20.

Referring to FIGS. 19-21, each of the driving electrodes TE, the sensing electrodes RE, and the dummy patterns DE may have a rectangular planar shape, but embodiments of the present disclosure are not limited thereto. The sensing electrodes RE may be arranged in the first direction (X-axis direction) and may be connected (e.g., electrically connected) to each other. The driving electrodes TE may be arranged in the second direction (Y-axis direction) and may be connected (e.g., electrically connected) to each other. Each of the dummy patterns DE may be disposed to be surrounded by the driving electrode TE or the sensing electrode RE. The driving electrodes TE, the sensing electrodes RE, and the dummy patterns DE may be electrically separated from each other. In one or more embodiments, the driving electrodes TE, the sensing electrodes RE, and the dummy patterns DE may be spaced apart from each other. The driving electrodes TE, the sensing electrodes RE, and the dummy patterns DE may be arranged to be spaced apart from each other.

In order for the sensing electrodes RE and the driving electrodes TE to be electrically separated or spaced apart at their intersections or crossings, the driving electrodes TE adjacent to each other in the second direction (Y-axis direction) may be connected through a first connection portion BE1, and the sensing electrodes RE adjacent to each other in the first direction (X-axis direction) may be connected through a second connection portion BE2. The first connection portion BE1 may be formed on a different layer from the driving electrodes TE, and may be connected to the driving electrodes TE through the first contact holes CNT1. In one or more embodiments, the first connection portion BE1 may be spaced apart from the sensing electrodes RE and overlap the sensing electrodes RE in the third direction (Z-axis direction).

The first connection portions BE1 may be formed to be bent at least once. Although it is illustrated in FIG. 19 that the first connection portions BE1 are bent in the shape of a clamp ("<" or ">"), the shape of the first connection portions BE1 in embodiments of the present disclosure is not limited thereto. Because the driving electrodes TE adjacent to each other in the second direction (Y-axis direction) are connected by the plurality of first connection portions BE1, even when any one of the first connection portions BE1 is disconnected, the driving electrodes TE adjacent to each other in the second direction (Y-axis direction) may be stably connected. Although it is illustrated in FIG. 19 that the driving electrodes TE adjacent to each other are connected by two first connection portions BE1, the number of the first connection portions BE1 in embodiments of the present disclosure is not limited thereto.

The second connection portion BE2 may be formed on the same layer as the sensing electrodes RE, and may have a shape extending from the sensing electrodes RE. The sensing electrodes RE and the second connection portion BE2 may be formed of the same material.

The driving electrodes TE, the sensing electrodes RE, the first connection portions BE1, and the second connection portions BE2 may be formed in a mesh structure or a network structure on the plane. The dummy patterns DE may also be formed in a mesh structure or a network structure on the plane. When the sensor electrode layer SENL including the driving electrodes TE and the sensing electrodes RE is formed on (e.g., directly on) the encapsulation layer TFEL, because the distance between the cathode electrode 173 of the light emitting element layer EML and the driving electrode TE or sensing electrode RE of the sensor electrode layer SENL is close, great parasitic capacitance may be formed between the cathode electrode 173 of the light emitting element layer EML and the driving electrode TE or sensing electrode RE of the sensor electrode layer SENL. Because the parasitic capacitance is proportional to the overlapping area between the cathode electrode 173 of the light emitting element layer EML and the driving electrode TE or sensing electrode RE of the sensor electrode layer SENL, the driving electrodes TE and the sensing electrodes RE may be formed in a mesh structure or a network structure on the plane.

Because the driving electrodes TE, the sensing electrodes RE, the dummy patterns DE, and the second connection portions BE2 are formed on the same layer, except for the sensing electrodes RE and the second connection portions BE2, they may be arranged to be spaced apart from each other. A gap or opening may be formed between the driving electrode TE and the sensing electrode RE, between the driving electrode TE and the second connection portion BE2, between the driving electrode TE and the dummy pattern DE, and between the sensing electrode RE and the dummy pattern DE. For convenience of description, it is shown in FIG. 20 that the boundary between the driving electrode TE and the sensing electrode RE, the boundary between the driving electrode TE and the second connection portion BE2, and the boundary between the sensing electrode RE and the second connection portion BE2 are dotted.

The first connection portion BE1 may be connected to the driving electrodes TE through the first contact holes CNT1. One end of the first connection portion BE1 may be connected to any one driving electrode TE of the driving electrodes TE adjacent to each other in the second direction (Y-axis direction) through the first contact holes CNT1. The other end of the first connection portion BE1 may be connected to another driving electrode TE of the driving electrodes TE adjacent to each other in the second direction (Y-axis direction) through the first contact hole CNT1. The first connection portion BE1 may overlap the driving electrodes TE and the sensing electrode RE in the third direction (Z-axis direction). In one or more embodiments, the first connection portion BE1 may overlap the second connection portion BE2 instead of the sensing electrode RE in the third direction (Z-axis direction). In one or more embodiments, the first connection portion BE1 may overlap both the sensing electrode RE and the second connection portion BE2 in the third direction (Z-axis direction). Because the first connection portion BE1 is formed on a different layer from the driving electrodes TE, the sensing electrodes RE, and the second connection portion BE2, even when the first connection portion BE1 overlaps the sensing electrode RE and/or the second connection portion BE2, the sensing electrode RE and/or the second connection portion BE2 may not be short-circuited.

The second connection portion BE2 may be disposed between the sensing electrodes RE. The second connection portion BE2 may be formed on the same layer as the sensing electrodes RE, and may extend from each of the sensing electrodes RE. Therefore, the second connection portion BE2 may be connected to the sensing electrodes RE without a separate contact hole.

The light emitting areas R, G, and B of the sub-pixels may include a first light emitting area R for emitting light of a first color, a second light emitting area G for emitting light of a second color, and a light emitting area B for emitting light of a third color. The first color may be red, the second color may be green, and the third color may be blue. Although it is illustrated in FIG. 20 that the first light emitting area R is a light emitting area of the first sub-pixel, the second light emitting area G is a light emitting area of the second sub-pixel, and the third light emitting area B is a light emitting area of the third sub-pixel, the embodiments of the present disclosure are not limited thereto. Although it is illustrated in FIG. 20 that each of the first light emitting area R, the second light emitting area G, and the third light emitting area B has a rectangular planar shape such as a rhombus, the embodiments of the present disclosure are not limited thereto. For example, each of the first light emitting area R, the second light emitting area G, and the third light emitting area B may have a polygonal, circular or elliptical planar shape other than or instead of the rectangular planar shape. Further, although it is illustrated in FIG. 20 that the size of the third light emitting area B is the largest and the size of the second light emitting area G is the smallest, the embodiments of the present disclosure are not limited thereto.

The pixel PXG refers to a group of sub-pixels capable of representing gradation. Although it is illustrated in FIG. 20 that the pixel PXG includes one first light emitting area R, two second light emitting areas G, and one third light emitting area B, and that the first to third light emitting areas (first light emitting area R, second light emitting area G, and third light emitting area B) are disposed in a planar diamond or rhombus shape, the embodiments of the present disclosure are not limited thereto.

Because the driving electrodes TE, the sensing electrodes RE, the dummy patterns DE, the first connection portions BE1, and the second connection portions BE2 are formed in a mesh structure or a network structure on the plane, the light emitting areas R, G, and B may not overlap the driving electrodes TE, the sensing electrodes RE, the dummy patterns DE, the first connection portions BE1, and the second connection portions BE2. Accordingly, light emitted from the light emitting areas R, G, and B is shrouded by the sensing electrodes RE, the dummy patterns DE, the first connection portions BE1, and the second connection portions BE2, thereby preventing or substantially preventing the reduction in luminance of light.

As shown in FIGS. 19-21, the pin hole PH of the sub-pixel SP may be disposed for every M sub-pixels in the first direction (X-axis direction). For example, as shown in FIG. 19, the pin hole PH of the sub-pixel SP may be disposed for every ten sub-pixels in the first direction (X-axis direction). In one or more embodiments, the pin holes PH may be spaced apart from each other by 100 μm (about 100 μm) to 450 μm (about 450 μm) in the first direction (X-axis direction).

The pin hole PH of the sub-pixel SP may be disposed for every N sub-pixels in the second direction (Y-axis direction). For example, as shown in FIG. 19, the pin hole PH of the sub-pixel SP may be disposed for every ten sub-pixels in the second direction (Y-axis direction). In one or more embodiments, the pin holes PH may be spaced apart from each other by 100 μm (about 100 μm) to 450 μm (about 450 μm) in the second direction (Y-axis direction).

Meanwhile, when the pinhole PH of the sub-pixel SP overlaps the driving electrodes TE, the sensing electrodes RE, the first connection portions BE1, and the second connection portions BE2, the light L2 reflected from the user's fingerprint is blocked or substantially blocked by the driving electrodes TE, the sensing electrodes RE, the first connection portions BE1, and the second connection portions BE2, so that the light L2 may not be incident on the sensor pixel FP of the fingerprint sensor FPS through the pin hole PH of the sub-pixels SP. Therefore, in order to prevent or substantially prevent the light L2 reflected from the user's fingerprint from being blocked or substantially blocked by the driving electrodes TE, the sensing electrodes RE, the first connection portions BE1, and the second connection portions BE2, the pinhole PH of the sub-pixel SP may not overlap the driving electrodes TE, the sensing electrodes RE, the first connection portions BE1, and the second connection portions BE2 in the third direction (Z-axis direction). That is, the driving electrodes TE, the sensing electrodes RE, the first connection portions BE1, and the second connection portions BE2, which are disposed in an area overlapping the pinholes PH of the sub-pixels SP, may be removed or omitted.

Figure 22:
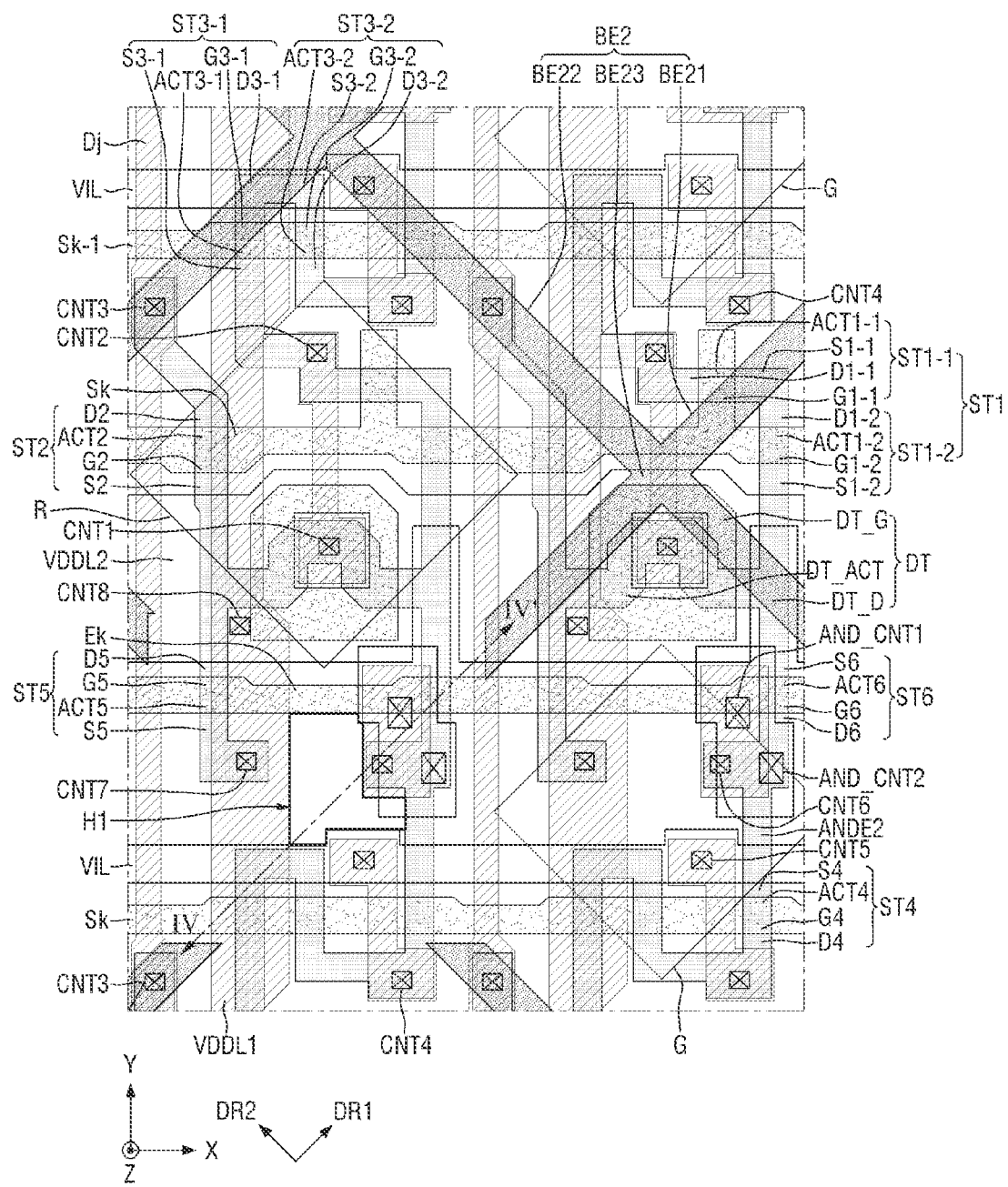
FIG. 22 is a plan view schematically illustrating a sub-pixel including a pinhole and sub-pixels therearound in FIG. 21.

FIG. 22 is a plan view schematically illustrating a sub-pixel including a pinhole and sub-pixels therearound in FIG. 21.

The embodiment of FIG. 22 is different from the embodiment of FIG. 19 in that the second connection portion BE2 of the sensor electrode layer SENL is disposed on the thin film transistor layer TFTL of the sub-pixel SP, and the first light emitting area R and the second light emitting area G are provided.

Referring to FIG. 22, the first light emitting area R and the second light emitting area G may have a rectangular planar shape such as a rhombus. In this case, the second connection portion BE2 may have a mesh structure or a network structure having a rectangular planar shape such as a rhombus shape.

The second connection portion BE2 may include a first sub-electrode BE21 disposed in one direction DR1, a second sub-electrode BE22 disposed in the other direction DR2 crossing the one direction DR1, and an intersection BE23 where the sub-electrode BE21 and the second sub-electrode BE22 intersect each other. In order to prevent or substantially prevent the light L2 reflected from the user's fingerprint from being blocked or substantially blocked by the second connection portion BE2, the second connection portion BE2 disposed in an area overlapping the pin hole PH of the sub-pixel SP in the third direction (Z-axis direction) may be removed or omitted. Specifically, the intersection BE23 of the second connection portion BE2 disposed in the area overlapping the pinhole PH of the sub-pixel SP in the third direction (Z-axis direction) may be removed or omitted. Further, a part of the first sub-electrode BE21 and a part of the second sub-electrode BE22, which are connected to the intersection BE23 of the second connection portion BE2 disposed in the area overlapping the pinhole PH of the sub-pixel SP in the third direction (Z-axis direction), may be removed or omitted.

As shown in FIG. 22, because the intersection BE23 of the second connection portion BE2 disposed in the area overlapping the pinhole PH of the sub-pixel SP in the third direction (Z-axis direction), a part of the first sub-electrode BE21, and a part of the second sub-electrode BE22 are removed or omitted, the light L2 reflected from the user's fingerprint may proceed to the pinhole PH of the sub-pixel SP without being blocked or substantially blocked by the second connection portion BE2. Therefore, the light L2 reflected from the user's fingerprint may be incident on the sensor pixel FP of the fingerprint sensor FPS overlapping the pinhole PH of the sub-pixel SP in the third direction (Z-axis direction) through the pinhole PH of the sub-pixel SP.

Further, in FIG. 22, the first light blocking layer SLL1 and the second light blocking layer SLL2 described with reference to FIGS. 10, 11, and 16-18 may be applied. Therefore, in FIG. 22, a description of the first light blocking layer SLL1 and the second light blocking layer SLL2 is not repeated.

Meanwhile, although the second connection portion BE2 and the pin hole PH have been described with reference to FIGS. 21 and 22, the driving electrode TE and the pin hole PH, and the sensing electrode RE and the pin hole PH may also be substantially the same as those described with reference to FIG. 22. Therefore, a description of the driving electrode TE and the pin hole PH and a description of the sensing electrode RE and the pin hole PH will not be repeated.

Figure 23:
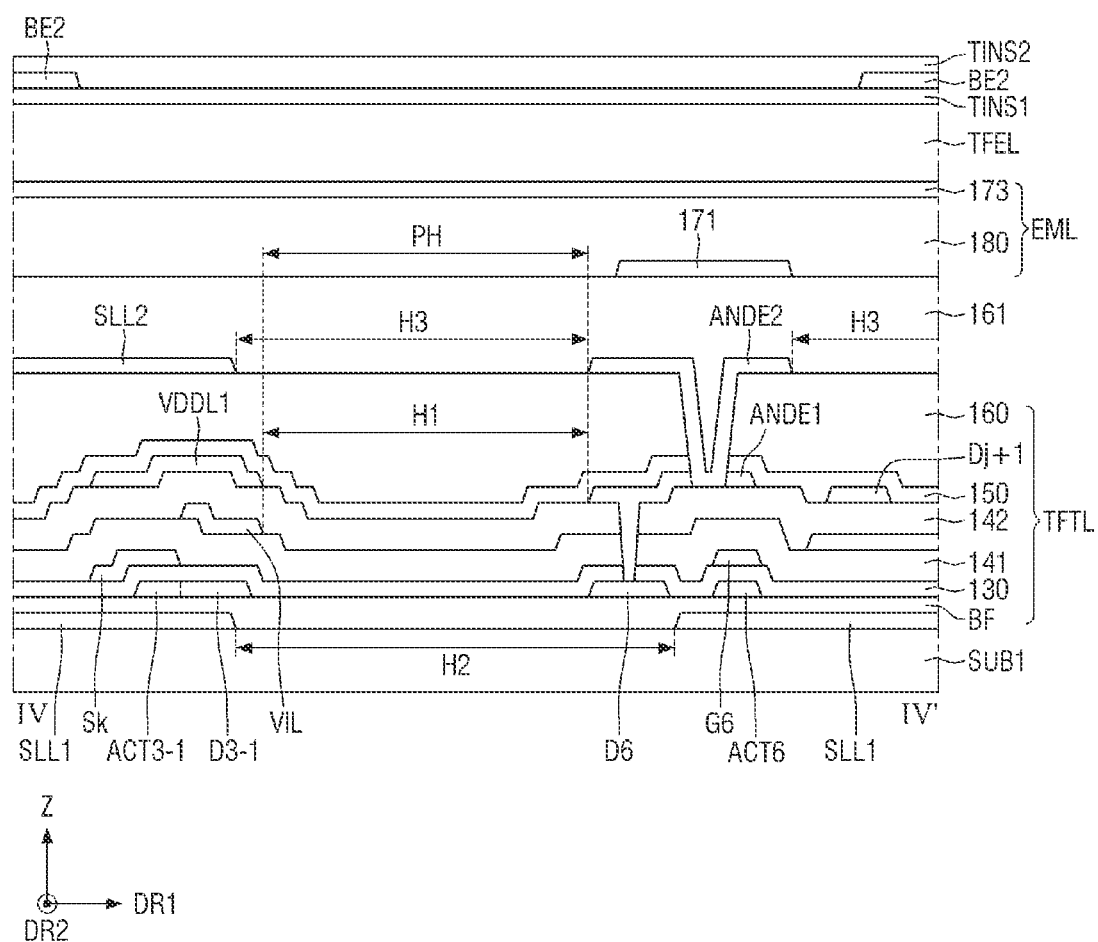
FIG. 23 is a cross-sectional view taken along the line IV-IV' of FIG. 22.

FIG. 23 is a cross-sectional view taken along the line IV-IV' of FIG. 22.

In FIG. 23, because the first light blocking layer SLL1, the thin film transistor layer TFTL, the second light blocking layer SLL2, the light emitting element layer EML, and the encapsulation layer TFEL are substantially the same as those described with reference to FIGS. 12-14, descriptions thereof will not be repeated.

Referring to FIG. 23, the sensor electrode layer SENL may be disposed on the encapsulation layer TFEL. Although FIG. 23 illustrates only the second connection portion BE2, the sensor electrode layer SENL may include driving electrodes TE, sensing electrodes RE, dummy patterns DE, first connection portions BE1, and second connection portions BE2, as shown in FIGS. 19 and 20.

The first connection portions BE1 may be formed on the encapsulation layer TFEL. The first connection portions BE1 may be formed of a laminate structure (Ti/Al/Ti) of aluminum and titanium, a laminate structure (ITO/Al/ITO) of aluminum and ITO, an APC alloy, or a laminate structure (ITO/APC/ITO) of APC alloy and ITO, but the embodiments of the present disclosure are not limited thereto. For example, the first connection portions BE1 may be formed as a single layer including molybdenum (Mo), titanium (Ti), copper (Cu), aluminum (Al), or ITO.

A first sensing insulating layer TINS1 is formed on the encapsulation layer TFEL. Also, first sensing insulating layer TINS1 is formed on the first connection portions BE1. The first sensing insulating layer TINS1 may be formed of an inorganic layer (e.g., a silicon nitride layer, a silicon oxynitride layer, a silicon oxide layer, a titanium oxide layer, or an aluminum oxide layer). In one or more embodiments, the first sensing insulating layer TINS1 may be formed of an organic layer including an acrylic resin, an epoxy resin, a phenolic resin, a polyamide resin, a polyimide resin, or the like.

Driving electrodes TE, sensing electrodes RE, dummy patterns DE, and second connection portions BE2 may be formed on the first sensing insulating layer TINS1. The driving electrodes TE, the sensing electrodes RE, the dummy patterns DE, and the second connection portions BE2 may be formed of a laminate structure (Ti/Al/Ti) of aluminum and titanium, a laminate structure (ITO/Al/ITO) of aluminum and ITO, an APC alloy, or a laminate structure (ITO/APC/ITO) of APC alloy and ITO, but the embodiments of the present disclosure are not limited thereto. For example, the driving electrodes TE, the sensing electrodes RE, the dummy patterns DE, and the second connection portions BE2 may be formed as a single layer including molybdenum (Mo), titanium (Ti), copper (Cu), aluminum (Al), or ITO.

Contact holes penetrating the first sensing insulating layer TINS1 may be formed in the first sensing insulating layer TINS1 to expose the first connection portions BE1. The driving electrodes TE may be connected to the first connection portions BE1 through the contact holes.

A second sensing insulating layer TINS2 is formed on the driving electrodes TE and the sensing electrodes RE. The second sensing insulating layer TINS2 may serve to planarize a step due to the driving electrodes TE, the sensing electrodes RE, and the first connection portions BE1. The second sensing insulating layer TINS2 is formed of an organic layer including an acrylic resin, an epoxy resin, a phenolic resin, a polyamide resin, a polyimide resin, or the like.

As shown in FIGS. 20 and 23, the first connection portions BE1 connecting the driving electrodes TE adjacent to each other in the second direction (Y-axis direction) are disposed on the encapsulation layer TFEL, and the driving electrodes TE, the sensing electrodes RE, the dummy patterns DE, and the second connection portions BE2 may be disposed on the first sensing insulating layer TINS1. Therefore, the driving electrodes TE and the sensing electrodes RE may be electrically separated or spaced apart at their intersections or crossings, the sensing electrodes RE may be connected (e.g., electrically connected) in the first direction (X-axis direction), and the driving electrodes TE may be connected (e.g., electrically connected) in the second direction (Y-axis direction).

FIG. 24 is an exemplary view of the first light blocking layer, second light blocking layer and sensor electrode of FIG. 23.

Referring to FIG. 24, a first hole H1 defined by at least one layer TFL (e.g., inner side walls of at least one layer TFL) of the thin film transistor layer TFTL, a second hole H2 defined by the first light blocking layer SLL1 (e.g., inner side walls of the first light blocking layer SSL1), a third hole H3 defined by the second light blocking layer SLL2 (e.g., inner side walls of the second light blocking layer SLL2), and a sensor electrode SE are illustrated.

The at least one layer TFL of the thin film transistor layer TFTL may be at least one of an active layer, a first gate metal layer, a second gate metal layer, or a data metal layer. The first hole H1 may be defined by any one layer or any two layers of the active layer, the first gate metal layer, the second gate metal layer, and the data metal layer.

The sensor electrode SE may be at least one of the driving electrode TE, the sensing electrode RE, the dummy pattern DE, or the second connection portion BE2.

As shown in FIG. 24, the virtual vertical line VL1 extending in the third direction (Z-axis direction) from an end of at least one layer TFL of the thin film transistor layer TFTL defining the first hole H1 may be defined. The distance from at least one layer TFL of the thin film transistor layer TFTL to a layer SEL in which the sensor electrode SE is disposed along the virtual vertical line VL1 may be defined as or indicated by the distance a as shown in FIG. 24. As shown in FIG. 23, the layer SEL in which the sensor electrode SE is disposed may be an upper layer of the first sensor insulating layer TINS1.

Further, when the virtual contact point of the virtual vertical line VL1 and the layer SEL in which the sensor electrode SE is disposed is defined as CP, the distance from the virtual contact CP to the sensor electrode SE in the horizontal direction HR may be defined as or indicated by the distance b as shown in FIG. 24. The horizontal direction HR is a direction orthogonal to the third direction (Z-axis direction), and may include the first direction (X-axis direction), the second direction (Y-axis direction), one direction DR1, and the other direction DR2, which are shown in FIG. 23.

Further, the virtual line connecting the sensor electrode SE by the shortest distance from the end of at least one layer TFL of the thin film transistor layer TFTL defining the first hole H1 may be defined as VL2. Further, the angle formed between the virtual vertical line VL1 and the virtual line VL2 may be defined as θ.

In this case, the distance b from the virtual contact CP to the sensor electrode SE in the horizontal direction HR may be calculated by Equation 2.

$$b = a \times \tan\theta \qquad \text{Equation 2}$$

In this case, the angle θ formed between the virtual vertical line VL1 and the virtual line VL2 may be 33° in consideration of a path through which the light L2 reflected from the fingerprint of the finger F is incident. Further, the distance a from at least one layer TFL of the thin film transistor layer TFTL to the layer SEL in which the sensor electrode SE is disposed along the virtual vertical line VL1 may be about 13.3 μm. In this case, the distance b from the virtual contact CP to the sensor electrode SE in the horizontal direction HR may be calculated as about 8.6 μm.

As shown in FIG. 24, when at least one layer TFL of the thin film transistor layer TFTL defining the first hole H1 is defined, how far the sensor electrode SE is or can be disposed in the horizontal direction HR with respect to the end of the first hole H1 may be calculated. Accordingly, the light L2 reflected from the user's fingerprint may proceed to the pin hole PH of the sub-pixel SP without being blocked or substantially blocked by the sensor electrode SE. Therefore, the light L2 reflected from the user's fingerprint may be incident on the sensor pixel FP of the fingerprint sensor FPS overlapping the pin hole PH of the sub-pixel SP in the third direction (Z-axis direction) through the pin hole PH of the sub-pixel SP.

Although some embodiments of the present disclosure have been disclosed for illustrative purposes, those skilled in the art will appreciate that various modifications, additions and substitutions are possible, without departing from the scope and spirit of the disclosure as defined by the accompanying claims and equivalents thereof.

What is claimed is:

1. A display device, comprising:
a substrate;
a first layer on a first surface of the substrate;
a first insulating film on the first layer;
a second layer on the first insulating film;
a second insulating film on the second layer;
an anode electrode on the second insulating film;
a light emitting layer on the anode electrode;
a cathode electrode on the light emitting layer,
wherein an area in which the first layer and the second layer do not overlap with each other is defined,
wherein the area comprises a first portion parallel to a first direction and a second portion parallel to a second direction,
wherein the second layer comprises a scan line, and
wherein at least a portion of the scan line extends in the first direction.

2. The display device of claim 1, wherein the first layer comprises an active layer of a transistor, and
wherein the second layer comprises a gate electrode of the transistor.

3. The display device of claim 2, further comprising:
a third layer disposed on the first surface of the substrate; and
a third insulating film disposed on the third layer,
wherein the first layer is disposed on the third insulating film.

4. The display device of claim 3, wherein the first layer, the second layer and the third layer do not overlap with each other in the area.

5. The display device of claim 4, wherein the third layer overlaps the active layer of the transistor.

6. The display device of claim 2, further comprising:
a fourth layer disposed on the second insulating film; and
a fourth insulating film disposed on the fourth layer,
wherein the anode electrode is disposed on the fourth insulating film.

7. The display device of claim 6, wherein the first layer, the second layer and the fourth layer do not overlap with each other in the area.

8. The display device of claim 7, wherein the fourth layer comprises a connection electrode, and
wherein the anode electrode is connected to the connection electrode through a contact hole penetrating the fourth insulating film.

9. The display device of claim 1, wherein the first layer comprises a source region or a drain region, and
wherein at least a portion of the source region or the drain region extends in the second direction.

10. The display device of claim 1, wherein the area further comprises a third portion parallel to a third direction which is a different from the first direction and the second direction.

11. The display device of claim 10, wherein the third direction is a diagonal direction against the first direction and the second direction.

12. The display device of claim 1, further comprising:
a sensor disposed on a second surface of the substrate to detect light incident through the area.

13. The display device of claim 12, wherein the sensor comprises a sensor pixel overlapping the area in a thickness direction of the substrate.

14. The display device of claim 1, further comprising:
an encapsulation layer disposed on the cathode electrode; and
a plurality of sensor electrodes disposed on the encapsulation layer,
wherein the first layer, the second layer and the plurality of sensor electrodes do not overlap with each other in the area.

15. A display device, comprising:
a substrate;
a first layer on a first surface of the substrate;
a first insulating film on the first layer;
a second layer on the first insulating film;
a second insulating film on the second layer;
an anode electrode on the second insulating film;
a light emitting layer on the anode electrode;
a cathode electrode on the light emitting layer,
wherein an area in which the first layer and the second layer do not overlap with each other is defined,
wherein the area comprises a first portion parallel to a first direction and a second portion parallel to a second direction, and
wherein a first maximum length of the area in the first direction is smaller than a second maximum length of the area in the second direction.

* * * * *